(12) United States Patent
Dordi et al.

(10) Patent No.: US 6,585,876 B2
(45) Date of Patent: Jul. 1, 2003

(54) FLOW DIFFUSER TO BE USED IN ELECTRO-CHEMICAL PLATING SYSTEM AND METHOD

(75) Inventors: Yezdi N. Dordi, Palo Alt, CA (US); Joseph J. Stevens, San Jose, CA (US); H. Peter W. Hey, Sunnyvale, CA (US); Donald J. K. Olgado, Palo Alto, CA (US)

(73) Assignee: Applied Materials Inc., Santa Clara, CA (US)

( * ) Notice: Subject to any disclaimer, the term of this patent is extended or adjusted under 35 U.S.C. 154(b) by 146 days.

(21) Appl. No.: 09/731,326

(22) Filed: Dec. 5, 2000

(65) Prior Publication Data

US 2001/0052465 A1 Dec. 20, 2001

Related U.S. Application Data

(63) Continuation-in-part of application No. 09/289,074, filed on Apr. 8, 1999, now Pat. No. 6,258,220.
(60) Provisional application No. 60/216,204, filed on Jul. 6, 2000.

(51) Int. Cl.[7] ............................. C25D 5/20; C25D 3/60; C25D 5/50; C25D 3/16
(52) U.S. Cl. .................. 205/148; 204/224 R; 204/252; 204/275.1
(58) Field of Search ................ 204/275.1, 224 R, 204/148, 252

(56) References Cited

U.S. PATENT DOCUMENTS

| | | | |
|---|---|---|---|
| 3,727,620 A | 4/1973 | Orr | 134/95 |
| 3,770,598 A | 11/1973 | Creutz | 204/52 R |
| 4,027,686 A | 6/1977 | Shortes et al. | 134/33 |
| 4,092,176 A | 5/1978 | Kozai et al. | 134/186 |
| 4,110,176 A | 8/1978 | Creutz et al. | 204/52 R |
| 4,113,492 A | 9/1978 | Sato et al. | 96/67 |
| 4,315,059 A | 2/1982 | Raistrick et al. | 429/112 |
| 4,336,114 A | 6/1982 | Mayer et al. | 204/52 R |
| 4,376,685 A | 3/1983 | Watson | 204/52 R |
| 4,405,416 A | 9/1983 | Raistrick et al. | 204/68 |

(List continued on next page.)

FOREIGN PATENT DOCUMENTS

| | | | | |
|---|---|---|---|---|
| JP | 58182823 | 10/1983 | | H01L/21/288 |
| JP | 63118093 | 5/1988 | | C25D/5/18 |
| JP | 04131395 | 5/1992 | | C25D/5/34 |

(List continued on next page.)

OTHER PUBLICATIONS

Australian Patent Office Written Opinion from SG 9906158–2, Dated Mar. 5, 2002.
Graham, Kenneth A., *Electroplating Engineering Handbook*, 2th Edition. (Copy not available to Applicant at this time), (No Date).

(List continued on next page.)

*Primary Examiner*—Donald R. Valentine
(74) *Attorney, Agent, or Firm*—Moser, Patterson & Sheridan

(57) ABSTRACT

An apparatus comprising an electrolyte cell, an anode, and a porous rigid diffuser. The electrolyte cell is configured to receive a substrate to have a metal film deposited thereon. An anode is contained within the electrolyte cell. A porous rigid diffuser is connected to the electrolyte cell and extends across the electrolyte cell. The diffuser is positioned between a location that the substrate is to be positioned when the metal film is deposited thereon and the anode.

38 Claims, 26 Drawing Sheets

U.S. PATENT DOCUMENTS

| | | | | |
|---|---|---|---|---|
| 4,428,815 A | | 1/1984 | Powell et al. | 204/297 |
| 4,435,266 A | | 3/1984 | Johnston | 204/276 |
| 4,466,864 A | * | 8/1984 | Bacon et al. | 205/148 X |
| 4,489,740 A | | 12/1984 | Rattan et al. | 134/140 |
| 4,510,176 A | | 4/1985 | Cuthbert et al. | 427/82 |
| 4,518,678 A | | 5/1985 | Allen | 430/311 |
| 4,519,846 A | | 5/1985 | Aigo | 134/15 |
| 4,693,805 A | | 9/1987 | Quazi | 204/192.22 |
| 4,732,785 A | | 3/1988 | Brewer | 427/240 |
| 5,039,381 A | | 8/1991 | Mullarkey | 204/47.5 |
| 5,055,425 A | | 10/1991 | Leibovitz et al. | 437/195 |
| 5,092,975 A | | 3/1992 | Yamamura et al. | 204/198 |
| 5,155,336 A | | 10/1992 | Gronet et al. | 219/411 |
| 5,162,260 A | | 11/1992 | Leibovitz et al. | 437/195 |
| 5,222,310 A | | 6/1993 | Thompson et al. | 34/202 |
| 5,224,504 A | | 7/1993 | Thompson et al. | 134/155 |
| 5,230,743 A | | 7/1993 | Thompson et al. | 134/32 |
| 5,252,807 A | | 10/1993 | Chizinsky | 219/390 |
| 5,256,274 A | | 10/1993 | Poris | 205/123 |
| 5,259,407 A | | 11/1993 | Tuchida et al. | 134/151 |
| 5,290,361 A | | 3/1994 | Hayashida et al. | 134/2 |
| 5,316,974 A | | 5/1994 | Crank | 437/190 |
| 5,328,589 A | | 7/1994 | Martin | 205/296 |
| 5,349,978 A | | 9/1994 | Sago et al. | 134/153 |
| 5,368,711 A | | 11/1994 | Poris | 204/193 |
| 5,377,708 A | | 1/1995 | Bergman et al. | 134/105 |
| 5,415,890 A | | 5/1995 | Kloiber et al. | 427/242 |
| 5,429,733 A | | 7/1995 | Ishida | 204/224 R |
| 5,447,615 A | | 9/1995 | Ishida | 204/224 R |
| 5,516,412 A | | 5/1996 | Andricacos et al. | 204/224 R |
| 5,608,943 A | | 3/1997 | Konishi et al. | 15/302 |
| 5,625,170 A | | 4/1997 | Poris | 177/50 |
| 5,651,865 A | | 7/1997 | Sellers | 204/192.13 |
| 5,705,223 A | | 1/1998 | Bunkofske | 427/240 |
| 5,718,813 A | | 2/1998 | Drummond et al. | 204/192.12 |
| 5,723,028 A | | 3/1998 | Poris | 204/231 |
| 6,071,388 A | | 6/2000 | Uzoh | 204/297 R |
| 6,093,291 A | | 7/2000 | Izumi et al. | 204/224 R |
| 6,113,759 A | * | 9/2000 | Uzoh | 204/285 |
| 6,179,983 B1 | | 1/2001 | Reid et al. | 205/96 |
| 6,228,232 B1 | * | 5/2001 | Woodruff et al. | 204/242 |
| 6,251,251 B1 | * | 6/2001 | Uzoh et al. | 204/283 X |
| 6,254,742 B1 | * | 7/2001 | Hanson et al. | 204/279 |
| 6,258,223 B1 | | 7/2001 | Cheung et al. | 204/242 |
| 6,261,433 B1 | | 7/2001 | Landau | 205/96 |
| 6,280,583 B1 | * | 8/2001 | Woodruff et al. | 204/242 |

FOREIGN PATENT DOCUMENTS

| | | | | |
|---|---|---|---|---|
| JP | | 04280993 | 10/1992 | C25D/5/18 |
| JP | | 6017291 | 1/1994 | C25D/7/12 |
| WO | | WO 97/12079 | 4/1997 | C25D/5/02 |
| WO | | WO 99/25902 | 5/1999 | C25B/13/00 |
| WO | | WO 99/25903 | 5/1999 | C25D/5/00 |
| WO | | WO 99/25904 | 5/1999 | C25D/5/02 |
| WO | | WO 99/25905 | 5/1999 | C25D/5/02 |
| WO | | WO 99/26275 | 5/1999 | |

OTHER PUBLICATIONS

PCT International Search Report dated Feb. 7, 2000.

Kenneth E. Pitney, "NEY Contact Manual," Electrical Contacts for Low Energy Uses, 1973, No Month.

Verteq Online©, "Products Overview," 1996–1998, 5 pages, (No Month).

Lucio Colombo, "Wafer Back Surface Film Removal," Central R&D, SGS–THOMPSON, Microelectronics, Agrage, Italy, 6 pages, (No Date).

Semitool©, Inc., "Metallization & Interconnect," 1998, 4 pages, No Month.

Laurell Technologies Corporation, "Two control configurations available–see *WS 400 OR WS–400Lite*." Oct. 19, 1998, 6 pages.

Peter Singer, "Tantalum, Copper and Damascene: The Future of Interconnects," Semiconductor International, Jun., 1998, Pages cover 91–92,94,96 & 98.

Peter Singer, "Wafer Processing," Semiconductor International, Jun., 1998, p. 70.

* cited by examiner

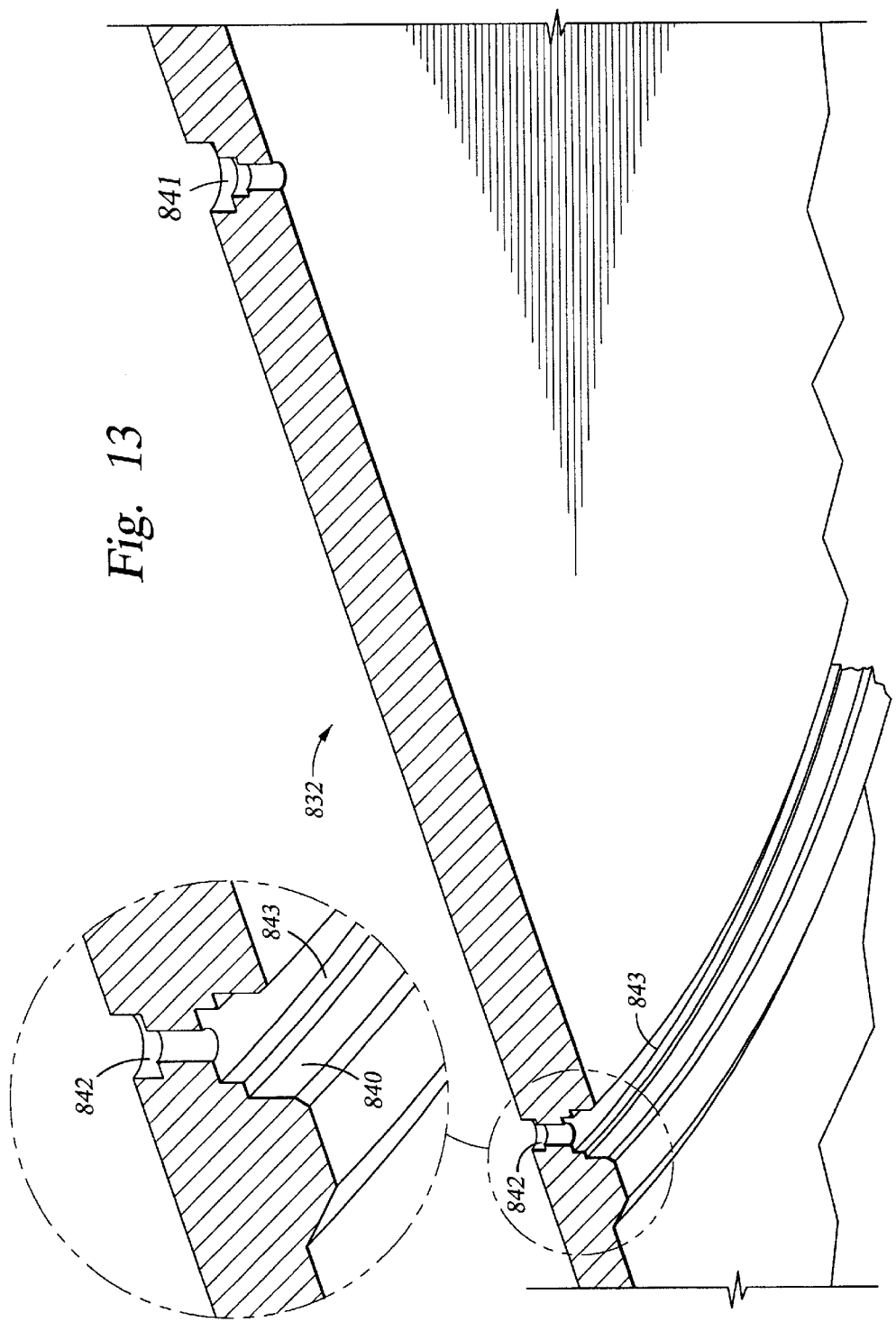

FLOW DIFFUSER TO BE USED IN ELECTRO-CHEMICAL PLATING SYSTEM AND METHOD

CONTINUATION INFORMATION

This disclosure claims priority to commonly assigned U.S. provisional patent application Ser. No. 60/216,204, filed on Jul. 6, 2000, entitled "FLOW DIFFUSER TO BE USED IN ELECTRO-CHEMICAL DEPOSITION SYSTEM".

This is a continuation-in-part of U.S. patent application Ser. No. 09/289,074, filed Apr. 8, 1999, Now U.S. Pat. No. 6,258,220 entitled "ELECTRO-CHEMICAL DEPOSITION SYSTEM".

BACKGROUND OF THE INVENTION

1. Field of the Invention

The present invention generally relates to deposition of a metal film onto a substrate. More particularly, the present invention relates to a flow diffuser to be used within an electrochemical plating (ECP) that electroplates a metal film on a seed layer on a substrate.

2. Background of the Related Art

As circuit densities increase, the widths of features such as vias and electric, contact elements, as well as the width of the dielectric materials between the features, have decreased over recent years. Electroplating, previously limited in integrated circuit design to the fabrication of lines on circuit boards, is now used to deposit metal films, such as copper, on substrates to form features. One feature filling embodiment that utilizes electroplating requires initially depositing a diffusion barrier layer on the substrate by a process such a physical vapor deposition (PVD) or chemical vapor deposition (CVD). A seed layer is deposited on the diffusion barrier layer by a process such as PVD or CVD to define a plating surface on the substrate. Metal ions are then deposited by electroplating on the substrate seed layer to form a metal film. Finally, the deposited metal film can be planarized by process, e.g., chemical mechanical polishing (CMP), to define a conductive interconnect feature. Electroplating is performed by establishing a voltage/current level between the seed layer on the substrate and a separate anode to deposit metal ions on the layer to form the deposited metal film.

Electrolyte solution is injected into in an electrolyte cell used for electrolplating from an inlet disposed below the anode, and the electrolyte solution follows a generally upward path. The fluid flow pattern of the electrolyte solution flowing around the anode plate to the upper surface of the anode plate is typically non-linear considering the shape and contour of the anode and the irregular fluid flow path around the anode. Providing as smooth of a fluid flow of electrolyte solution to the upper surface of the anode enhances the generation of metal ions in the electrolyte solution. Turbulence in the electrolyte solution flow adjacent the upper surface of the anode plate causes in eddies to form near the upper surface of the anode plate. The formation of such eddies obstructs the chemical reaction between the electrolyte solution and the anode. Electrolyte solution having a laminar flow interacts more uniformly and predictably with the anode than electrolyte solution having a turbulent flow. Since chemical reaction releases metal ions from the anode into the electrolyte solution, providing a turbulent flow adjacent the upper anode surface limits the chemical reaction between the electrolyte solution and the anode, and thereby reduces the quantity of metal ions released into reducing the quantity of metal ions released into the electrolyte solution limits the plating effectiveness. It is therefore desired to enhance the laminar flow characteristics forming adjacent the upper surface of the anode to improve the uniformity of metal ion generation by the anode into the electrolyte solution.

The fluid flow of the electrolyte solution from the anode to the seed layer on the substrate is generally directed perpendicularly upward towards the seed layer. One technique to provide uniformity of flow across the width of the electrolyte cell involves extending a diffuser across the width of the electrolyte cell. The diffuser is typically formed as a sheet or layer of permeable plastic. The diffuser is configured to permit the electrolyte solution containing the metal ions to pass through. Fluid pressure applied to the permeable plastic of the diffuser flexes or deforms the diffusers due to the flexibility of the diffuser. These prior art diffusers therefore bow or deform to assume an upwardly facing convex shape when electrolyte solution flows upwardly through the diffuser from below. The upward-directed convex configuration of the diffuser results in those portions of the diffuser being positioned about the center of the diffuser being located closer to the nearest location on the seed layer than those portions of the diffuser located about the periphery. The electric resistance of the electrolyte solution varies as a function of distance through the electrolyte solution. The electric current flow from the flow diffuser via the electrolyte solution to the seed layer is therefore increased at the nearest location on the seed layer since the electric resistance of the electrolyte solution diminishes as distance decreases. As such, the electric current density applied to the seed layer at the center of the substrate may be enhanced relative to the electric current density of those seed layer portions adjacent the periphery of the substrate.

Therefore, there remains a need for an electro-chemical plating system having a diffuser that enhances the uniformity of electric current density applied across the face of the seed layer. In one aspect, the diffuser would enhance the fluid flow to the upper surface of the anode to limit the turbulence, and thereby enhance the chemical reaction of the anode relative to the electrolyte solution.

SUMMARY OF THE INVENTION

The present invention generally provides a diffuser to be used in an electrochemical plating system. More particularly, an apparatus comprises an electrolyte cell, an anode, and a porous rigid diffuser. The electrolyte cell is configured to receive a substrate to have a metal film deposited thereon. An anode is contained within the electrolyte cell. A porous rigid diffuser is connected to the electrolyte cell and extends across the electrolyte cell. The diffuser is positioned between a location that the substrate is to be positioned when the metal film is deposited thereon and the anode.

BRIEF DESCRIPTION OF THE DRAWINGS

The teachings of the present invention can be readily understood by considering the following detailed description in conjunction with the accompanying drawings, in which:

FIG. 13 is a partial cross sectional view of one embodiment of a substrate holder plate of FIG. 12;

The terms "below", "above", "bottom", "top", "up", "down", "upper", and "lower" and other positional terms used herein are shown with respect to the embodiments in the figures and may be varied depending on the relative orientation of the processing apparatus.

DETAILED DESCRIPTION OF THE PREFERRED EMBODIMENT

Figure 2:
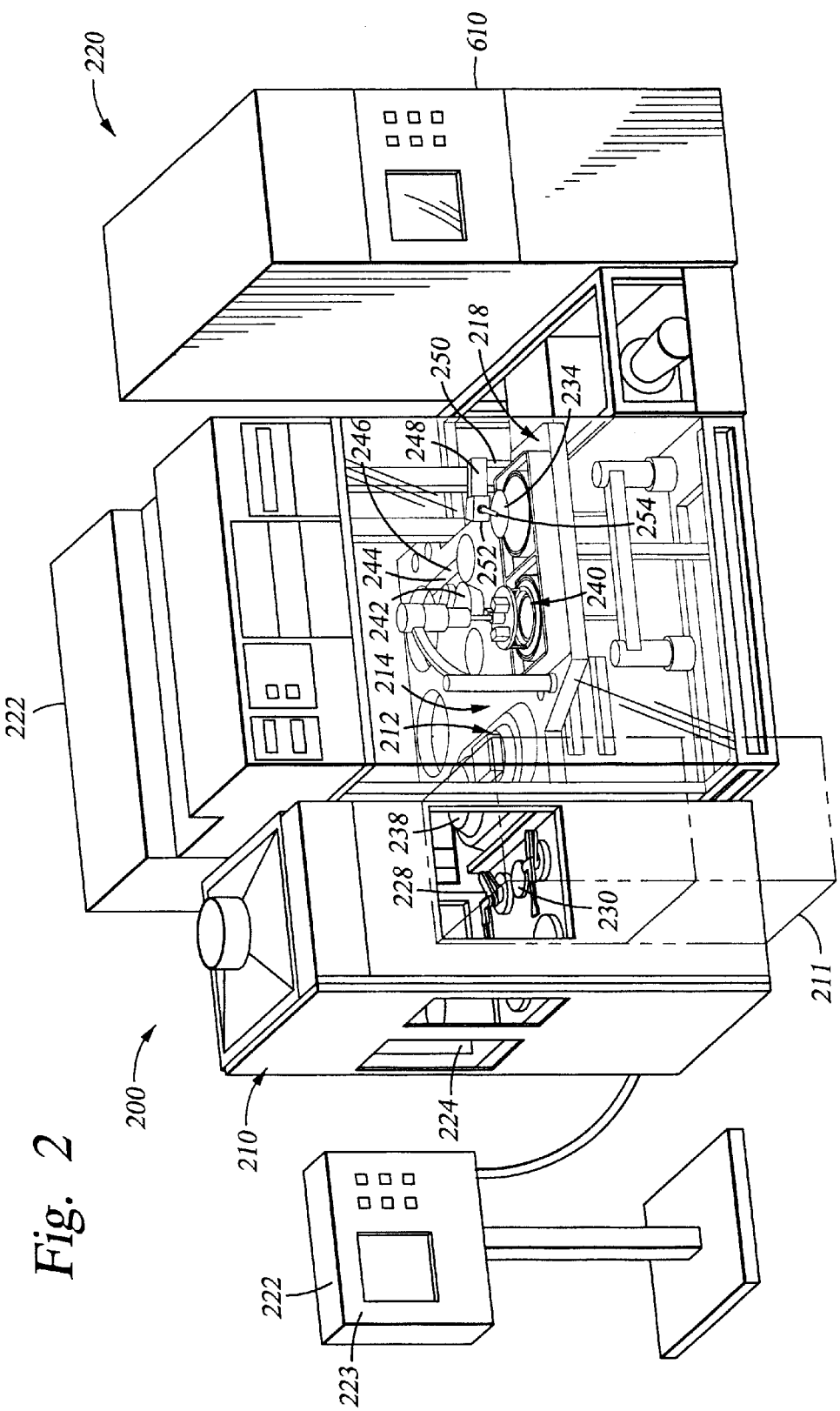
FIG. 2 is a perspective view of another embodiment of ECP system.
Figure 3:
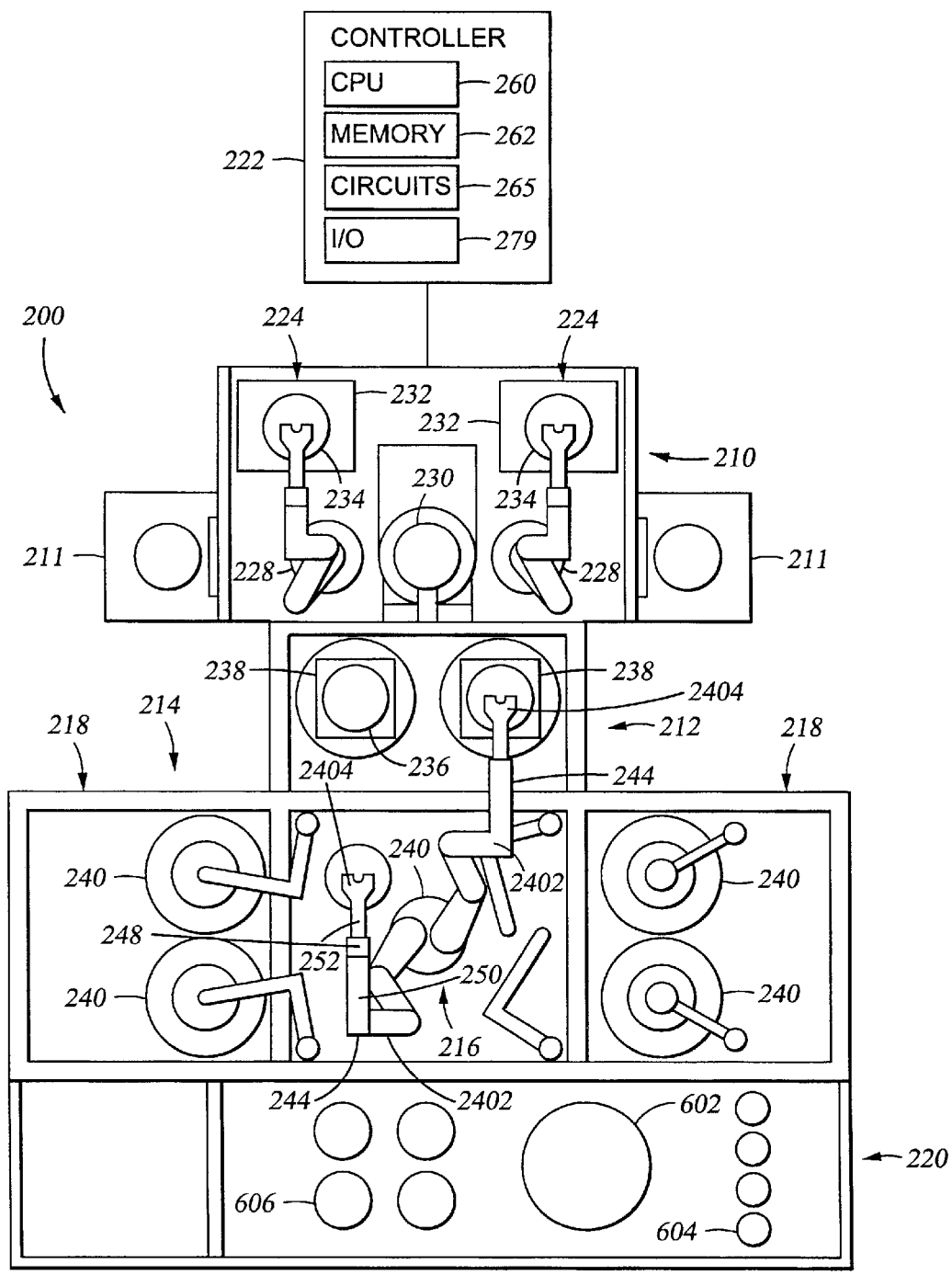
FIG. 3 is a top schematic view of the ECP system of FIG. 2.

One aspect of the invention relates to an Electro-Chemical Plating (ECP) system, such as system 200 in the embodiment shown in FIGS. 2 and 3, having a flow diffuser positioned between an anode and a seed layer. Multiple electroplating system embodiments are described in detail. The flow diffuser enhances the fluid flow of electrolyte solution and the electric current density applied across the seed layer. Multiple flow diffuser embodiments are described.

14. ECP System

Figure 1:
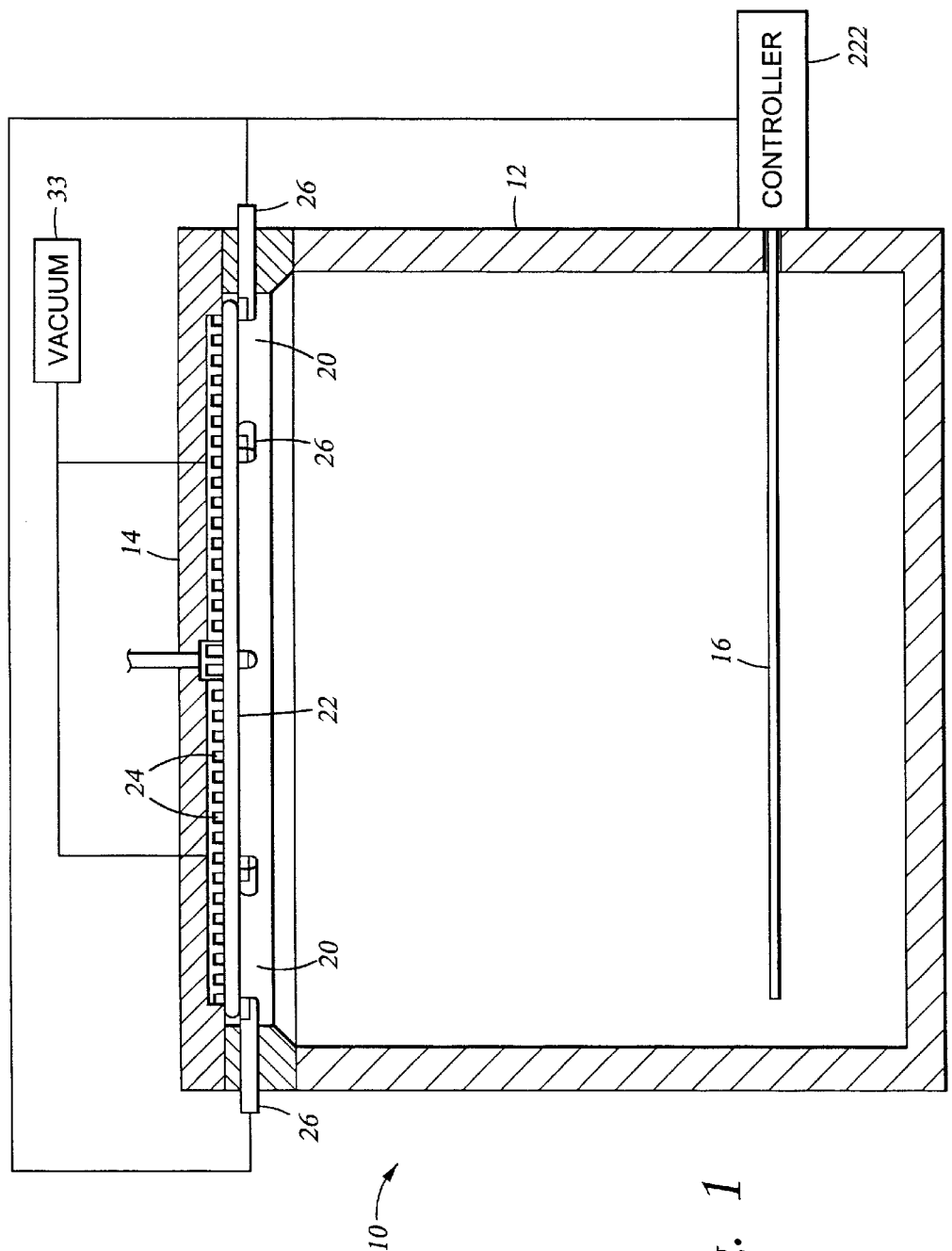
FIG. 1 is a cross sectional view of one embodiment of electrochemical plating (ECP) system.

The structure and operation of multiple embodiments of electro-chemical plating (ECP) system is now described. FIG. 1 shows one embodiment of electro-chemical plating (ECP) system 10, i.e. a fountain plater that is used in electroplating. The ECP system 10 includes an electrolyte cell 12, a substrate holder 14, an anode 16, and a contact ring 20. The electrolyte cell 12 contains electrolyte solution, and the electrolyte cell has a top opening 21 circumferentially defined by the contact ring 20. The substrate holder system 14 is disposed above the electrolyte cell, and is capable of displacing the substrate to be immersed in the electrolyte solution, and removed from the electrolyte solution, through the top opening. The substrate holder 14 is capable of securing and positioning the substrate in a desired position during processing. The contact ring 20 comprises a plurality of metal or metal alloy electrical contact elements that electrically contact the substrate seed layer. The electric contact elements take the form of contact pins, contact rods, contact surfaces, contact pads, etc.

FIG. 2 is a perspective view of one embodiment of ECP system 200. FIG. 3 is a top schematic view of the ECP system 200 of FIG. 2. Referring to both FIGS. 2 and 3, the ECP system 200 generally comprises a loading station 210, a rapid thermal anneal (RTA) chamber 211, a spin-rinse-dry (SRD) station 212, a mainframe 214, and an electrolyte solution replenishing system 220. Preferably, the ECP system 200 is enclosed in a clean environment using panels such as made from PLEXIGLAS® (a registered trademark of the Rohm and Haas Company of West Philadelphia, Pa.). The mainframe 214 generally comprises a mainframe transfer station 216 and a plurality of processing stations 218. Each processing station 218 includes one or more process cells 240. An electrolyte solution replenishing system 220 is positioned adjacent the ECP system 200 and connected to the process cells 240 individually to circulate electrolyte solution used for the electroplating process. The ECP system 200 also includes a controller 222, typically comprising a programmable microprocessor and interacting with a solid-state power supply.

A controller 222 controls the electric current/voltage supplied to the electric contact and to the anode. Typically, the controller 222 is associated with a controllable power supply, such as semi-conductor power source, that supplies the electric current to the electric contact and to the anode. The controller controls the electrical current supplied to the seed layer when the seed layer on the substrate is being plated. The controller 222 thereby determines the electrical current/voltage established across from the anode to the seed layer on the substrate.

Figure 6:
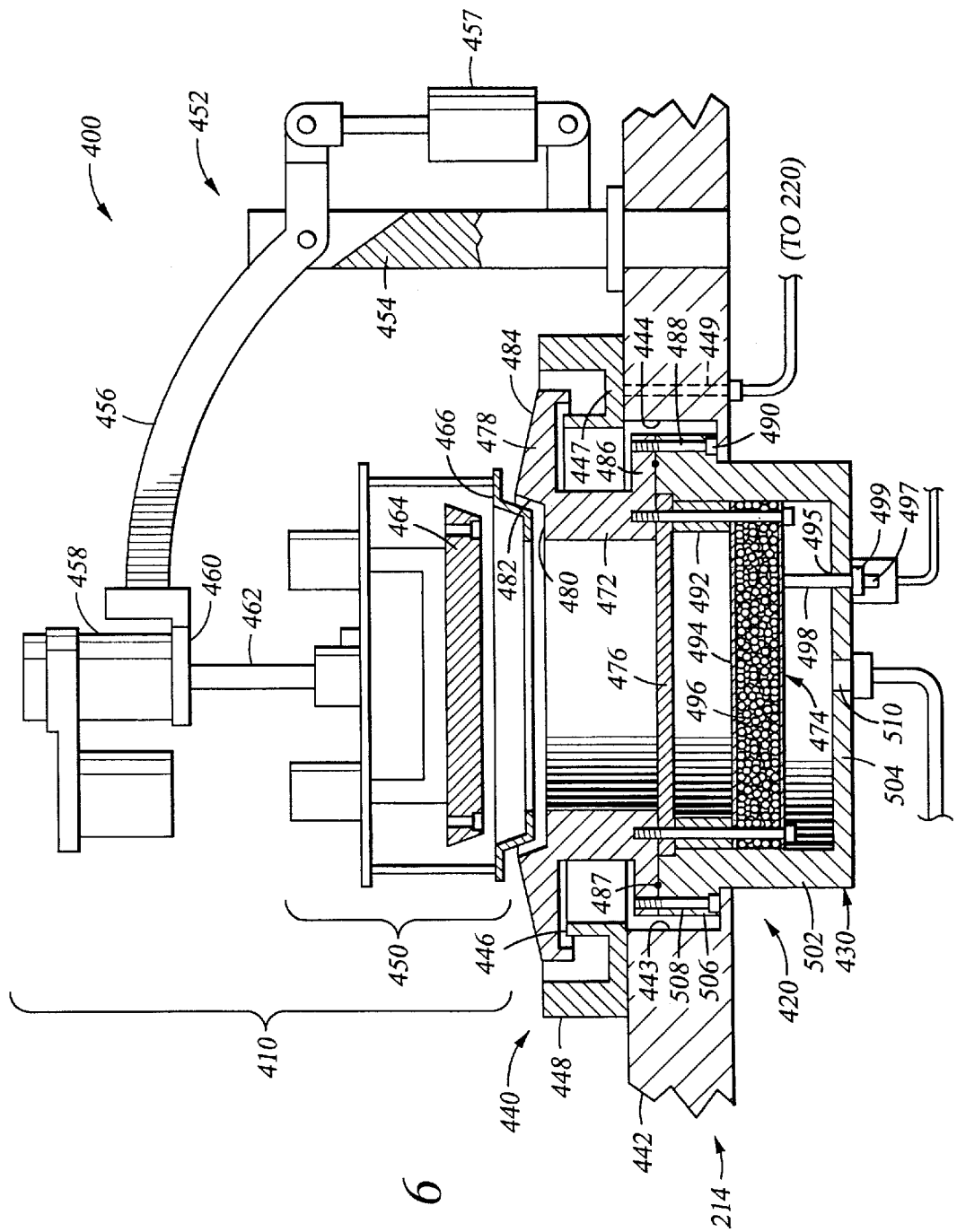
FIG. 6 is a cross sectional view of one embodiment of a process cell used in ECP processing.

The controller 222, whose components are shown in FIG. 3, comprises a central processing unit (CPU) 260, memory 262, circuit portion 265, input output interface (I/O) 279, and bus, not shown. The controller 222 may be a general-purpose computer, a microprocessor, a microcontroller, or any other known suitable type of computer or controller. The CPU 260 performs the processing and arithmetic operations for the controller 222. The controller 222 controls the processing, robotic operations, timing, etc. associated with the ECP system 200. The controller controls the voltage applied to the anode 16, the plating surface 15 of the substrate 22, and the operation of the substrate holder assembly 450 as shown in FIG. 6.

The memory 262 includes random access memory (RAM) and read only memory (ROM) that together store the computer programs, operands, operators, dimensional values, system processing temperatures and configurations, and other parameters that control the electroplating operation. The bus provides for digital information transmissions between CPU 260, circuit portion 265, memory 262, and I/O 279. The bus also connects I/O 279 to the portions of the ECP system 200 that either receive digital information from, or transmit digital information to, controller 222.

I/O 279 provides an interface to control the transmissions of digital information between each of the components in controller 222. I/O 279 also provides an interface between the components of the controller 222 and different portions of the ECP system 200. Circuit portion 265 comprises all of the other user interface devices, such as display and keyboard.

In this disclosure, the term "substrate" is intended to describe substrates, semiconductor substrates, liquid crystal diode (LCD) displays, or other objects that can be processed within the ECP system 200. The substrates are generally cylindrical or rectangular, may be of any size, though they commonly have a 200 mm or 300 mm diameter, and may include such irregularities as notches or flatted surfaces that assist in providing and maintaining proper wafer orientation about its vertical axis. The loading station 210 preferably includes one or more substrate cassette receiving areas 224, one or more loading station transfer robots 228 and at least one substrate orientor 230. The number of substrate cassette receiving areas, loading station transfer robots 228 and substrate orientors included in the loading station 210 can be configured according to the desired throughput of the system. As shown for one embodiment in FIGS. 2 and 3, the loading station 210 includes two substrate cassette-receiving areas 224, two loading station transfer robots 228 and one substrate orientor 230. A substrate cassette 232 containing one or more substrates 234 in vertically-spaced cassette shelves provides a location where the substrates can be stored, removed from, or inserted in conjunction with the ECP system. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211.

Figure 4:
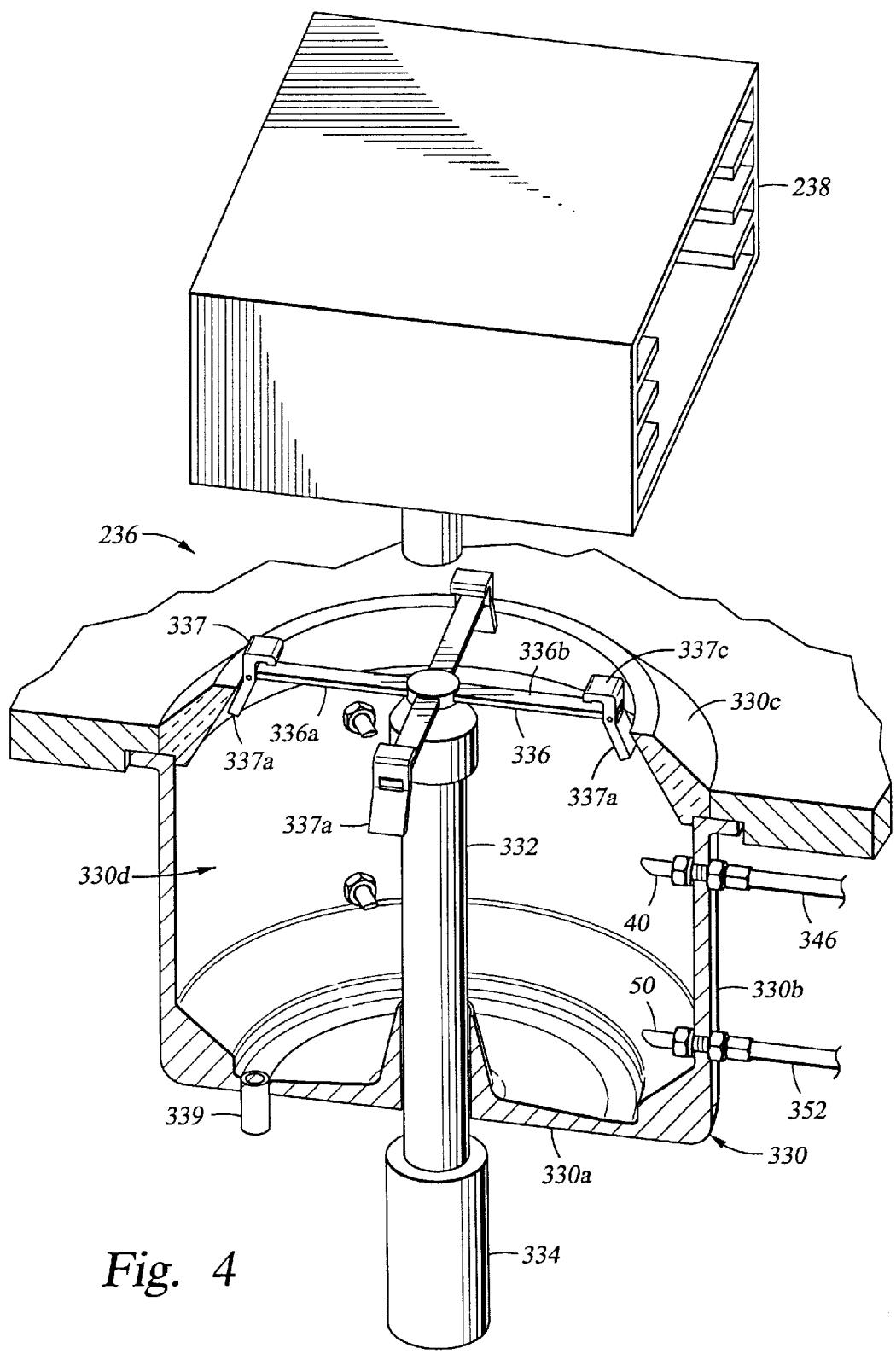
FIG. 4 is a schematic perspective view of one embodiment of a spin-rinse-dry (SRD) module of FIG. 3.
Figure 5:
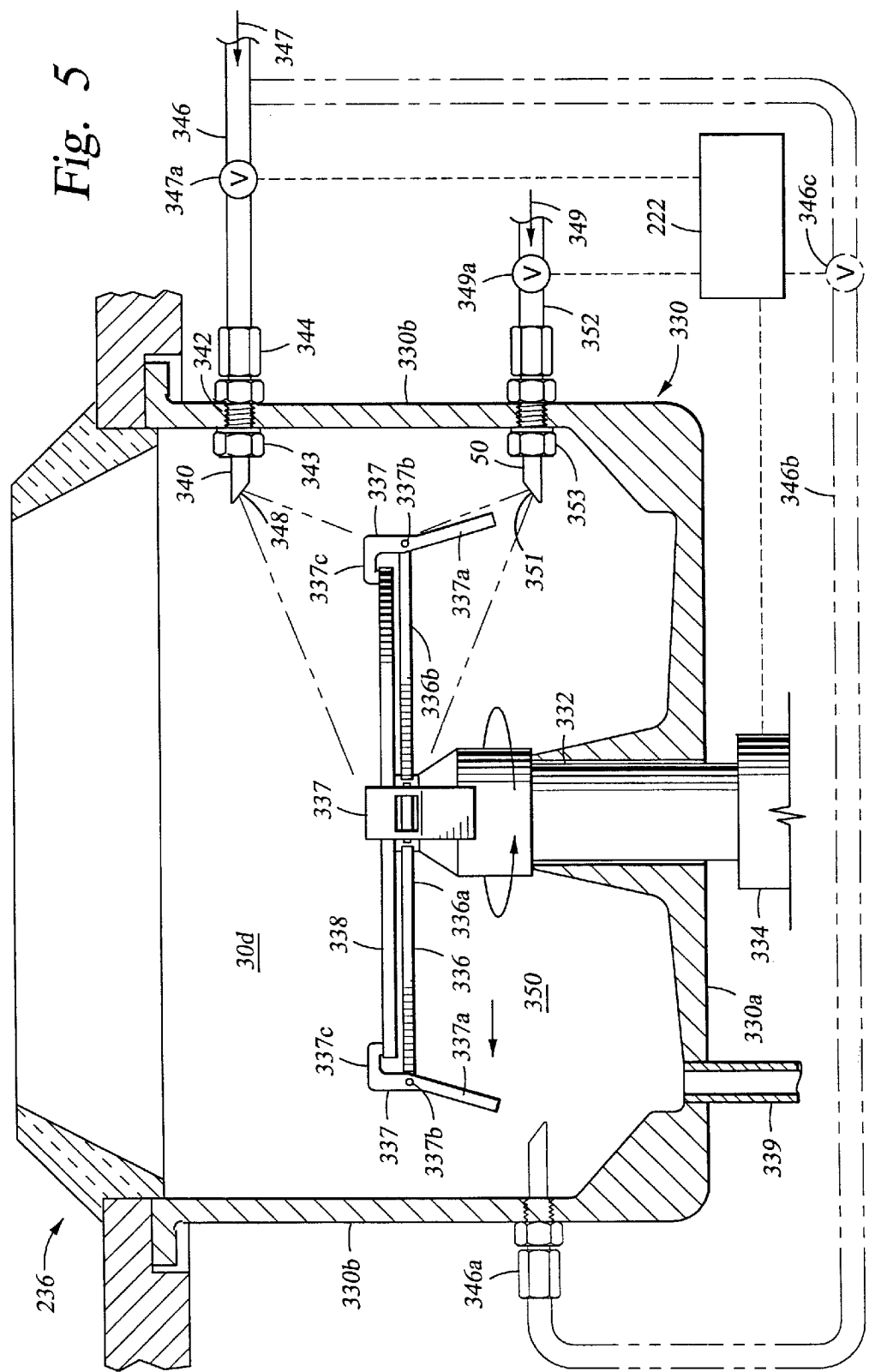
FIG. 5 is a side cross sectional view of the SRD module of FIG. 4.

FIG. 4 is a schematic perspective view of a spin-rinse-dry (SRD) module of the present invention, incorporating rinsing and dissolving fluid inlets. FIG. 5 is a side cross sectional view of the SRD module of FIG. 4 and shows a substrate in a processing position vertically disposed between fluid inlets. Preferably, the SRD station 212 includes one or more SRD modules 236 and one or more substrate pass-through cassettes 238. Preferably, the SRD station 212 includes two SRD modules 236 corresponding to the number of loading station transfer robots 228, and a substrate pass-through cassette 238 is positioned above each SRD module 236. The substrate pass-through cassette 238 facilitates substrate transfer between the loading station 210 and the mainframe 214. The substrate pass-through cassette 238 provides access to and from both the loading station transfer robot 228 and a robot in the mainframe transfer station 216.

The SRD module 236 is connected between the loading station 210 and the mainframe 214. The mainframe 214 generally comprises a mainframe transfer station 216 and a plurality of processing stations 218. Referring to FIGS. 2 and 3, the mainframe 214, as shown, includes two processing stations 218, each processing station 218 having two process cells 240. The mainframe transfer station 216 includes a mainframe transfer robot 242. Preferably, the mainframe transfer robot 242 comprises a plurality of individual robot arms 244 that provides independent access of substrates in the processing stations 218 and the SRD stations 212. As shown in FIG. 3, the mainframe transfer robot 242 comprises two robot arms 244, corresponding to the number of process cells 240 per processing station 218. Each robot arm 244 includes a robot blade 246 for holding a substrate during a substrate transfer. Preferably, each robot arm 244 is operable independently of the other arm to facilitate independent transfers of substrates in the system. Alternatively, the robot arms 244 operate in a linked fashion such that one robot extends as the other robot arm retracts.

Preferably, the mainframe transfer station 216 includes a flipper robot 248 that facilitates transfer of a substrate from a face-up position on the robot blade 246 of the mainframe transfer robot 242 to a face down position for a process cell 240 that requires face-down processing of substrates. The flipper robot 248 includes a main body 250 that provides both vertical and rotational movements with respect to a vertical axis of the main body 250 and a flipper robot arm 252 that provides rotational movement along a horizontal axis along the flipper robot arm 252. Preferably, a vacuum suction gripper 254, disposed at the distal end of the flipper robot arm 252, holds the substrate as the substrate is flipped and transferred by the flipper robot 248. The flipper robot 248 positions a substrate into the process cell 240 for face-down processing. The details of the electroplating process cell will be discussed below.

Figure 24:
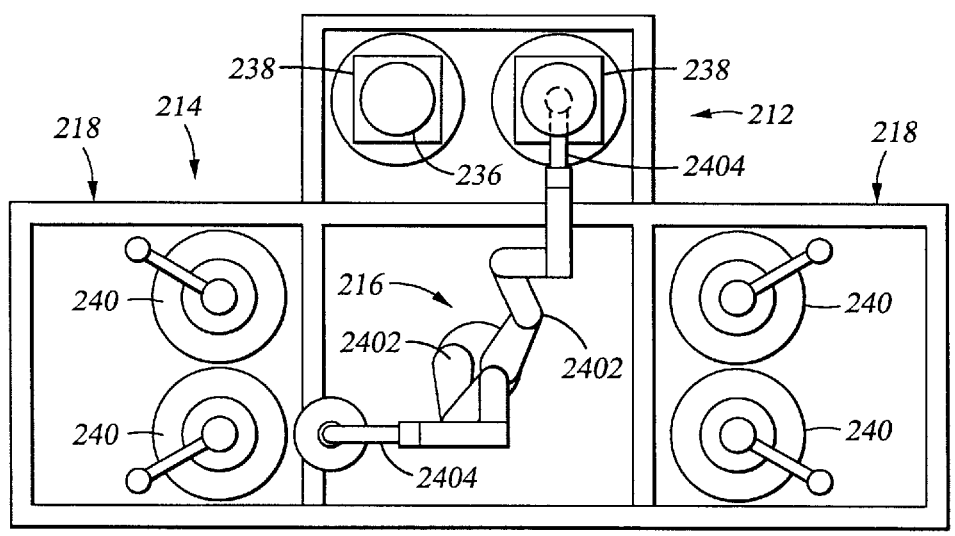
FIG. 24 is a top schematic view of a mainframe having a flipper robot incorporated therein.

FIG. 24 is a top schematic view of a mainframe transfer robot having a flipper robot incorporated therein. The mainframe transfer robot 242 as shown in FIG. 24 serves to transfer substrates between different stations attached the mainframe station, including the processing stations and the SRD stations. The mainframe transfer robot 242 includes a plurality of robot arms 2402, two are shown, and a flipper robot 2404 is attached as an end effector for each of the robot arms 2402. Flipper robots are generally known in the art and can be attached as end effectors for substrate handling robots, such as model RR701, available from Rorze Automation, Inc., located in Milpitas, Calif. The main transfer robot 242 comprising a flipper robot as the end effector is capable of transferring substrates between different stations attached to the mainframe as well as flipping the substrate being transferred to the desired surface orientation, i.e., substrate processing surface being face-down for the electroplating process. Preferably, the mainframe transfer robot 242 provides independent robot motion along the X-Y-Z axes by the robot arm 2402 and independent substrate flipping rotation by the flipper robot end effector 2404. By incorporating the flipper robot 2404 as the end effector of the mainframe transfer robot, the substrate transfer process is simplified because the step of passing a substrate from a mainframe transfer robot to a flipper robot is eliminated.

FIG. 6 is a cross sectional view of one embodiment of an electroplating process cell 400 of the ECP system of FIGS. 2 and 3. The electroplating process cell 400 generally comprises a head assembly 410, a process cell 420 and an electrolyte solution collector 440. Preferably, the electrolyte solution collector 440 is secured onto the body 442 of the mainframe 214 over an opening 443 that defines the location for placement of the process cell 420. The electrolyte solution collector 440 includes an inner wall 446, an outer wall 448 and a bottom 447 connecting the walls. An electrolyte solution outlet 449 is disposed through the bottom 447 of the electrolyte solution collector 440 and connected to the electrolyte solution replenishing system 220 shown in FIG. 2 through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process cell 420 to provide the spacing required to remove and/or replace the process cell 420 from the electroplating process cell 400. When the cantilever arm actuator 457 is extended, the cantilever arm 456 moves the head assembly 410 toward the process cell 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 7:
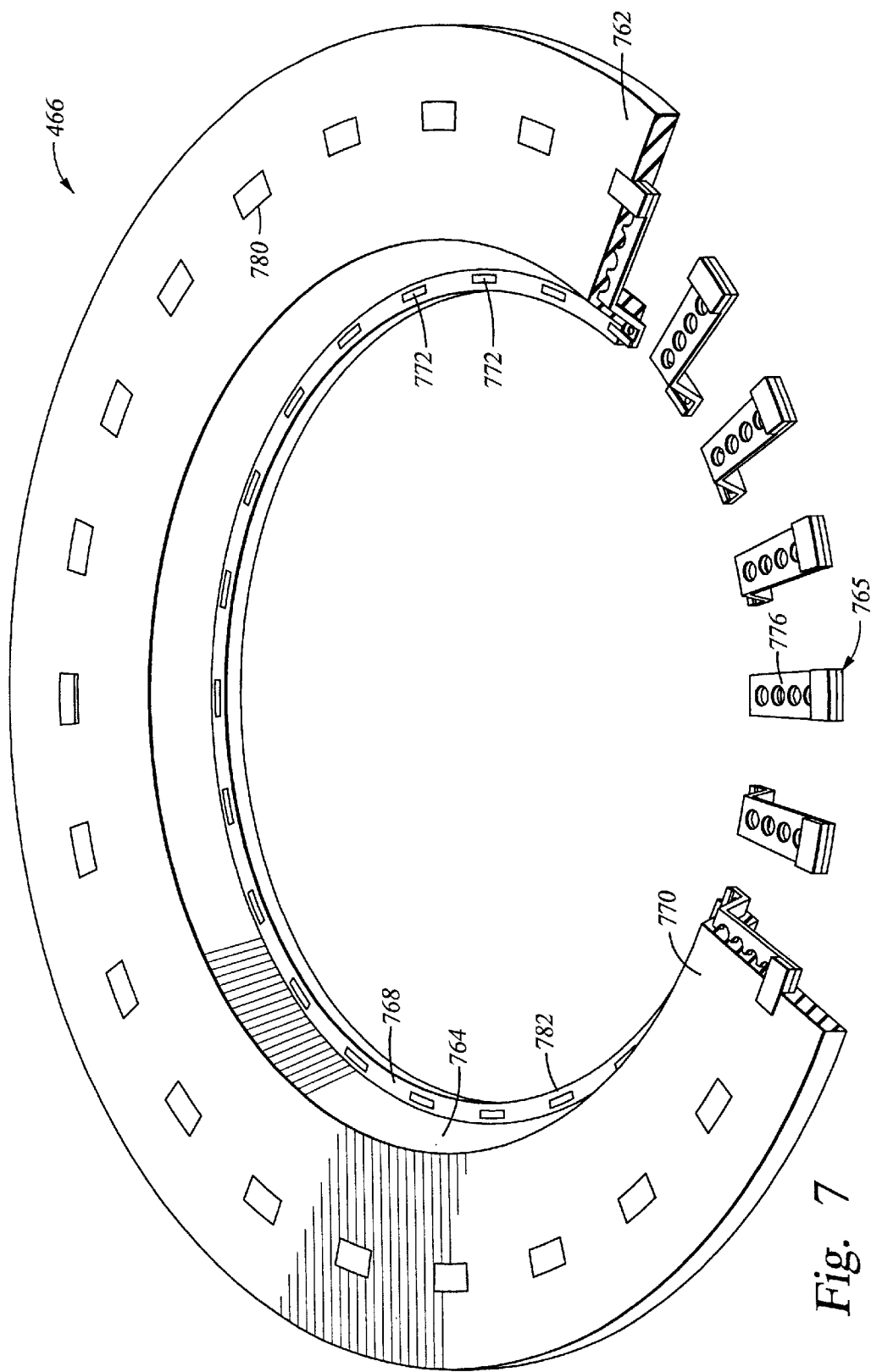
FIG. 7 is a partial cross sectional perspective view of one embodiment of cathode contact ring of FIG. 6.

The substrate holder assembly 450 generally comprises a substrate holder 464 and an electric contact element 466. FIG. 7 is a cross sectional view of one embodiment of a electric contact element 466. In general, the electric contact element 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the electric contact element 466 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762. The flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, electric contact element design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the electric contact element 466 may be substantially planar thereby eliminating the shoulder portion 764. However, for reasons described below, a preferred embodiment comprises the shoulder portion 764 shown in FIG. 6 or some variation thereof.

The conducting members 765 are defined by a plurality of outer electrical contact pads 780 annularly disposed on the flange 762, a plurality of inner electrical contact pads 772 disposed on a portion of the substrate seating surface 768, and a plurality of embedded conducting connectors 776 which link the pads 772, 780 to one another. The conducting members 765 are isolated from one another by the insulative body 770. The insulative body may be made of a plastic such as polyvinylidenefluoride (PVDF), perfluoroalkoxy resin (PFA), TEFLON® (a registered trademark of the E.I. duPont de Nemours and Company) and TEFZEL® (a registered trademark of the E.I. duPont de Nemours and Company) or any other insulating material such as Alumina ($Al_2O_3$) or other ceramics. The outer contact pads 780 are coupled to a power supply, not shown, to deliver current and voltage to the inner contact pads 772 via the connectors 776 during processing. In turn, the inner contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper, that has a resistivity of approximately $2 \times 10^{-8}$ Ω·M, coated with platinum that has a resistivity of approximately $10.6 \times 10^{-8}$ Ω·m. Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation that acts as an insulator, the inner contact pads 772 preferably comprise a material resistant to oxidation such as Pt, Ag, or Au.

Figures 8, 9:
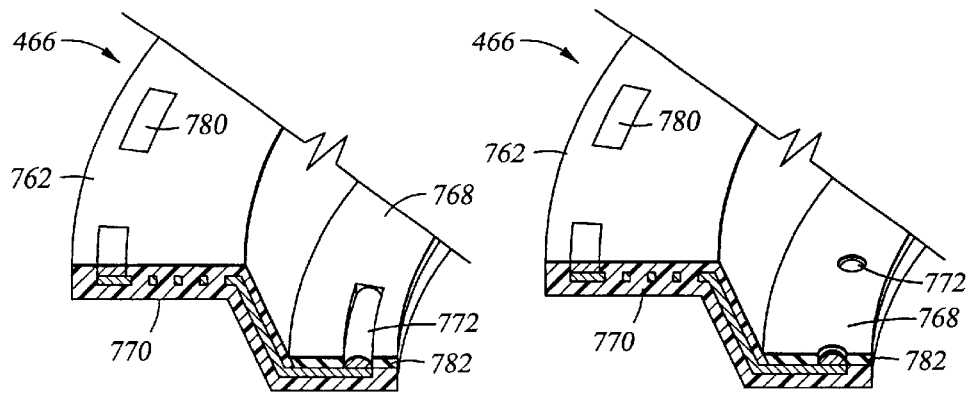
FIG. 8 is a cross sectional perspective view of an alternate embodiment of cathode contact ring of FIG. 6.
FIG. 9 is a cross sectional perspective view of the FIG. 6 cathode contact ring showing an alternative embodiment of the contacts and an isolation gasket.

In addition to being a function of the contact material, the total resistance of each circuit is dependent on the geometry, or shape, of the inner contact inner contact pads 772 and the force supplied by the contact ring 466. These factors define a constriction resistance, RCR, at the interface of the inner contact pads 772 and the substrate seating surface 768 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate which may be damaged under excessive force and resulting pressure. However, because pressure is related to both force and area, the maximum sustainable force is also dependent on the geometry of the inner contact pads 772. Thus, while the contact pads 772 may have a flat upper surface as in FIG. 7, other shapes may be used to advantage. For example, two preferred shapes are shown in FIGS. 8 and 9. FIG. 8 shows a knife-edge contact pad and FIG. 9 shows a hemispherical contact pad. A person skilled in the art will readily recognize other shapes which may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of connectors 776 may be varied depending on the particular number of desired contact pads 772, shown in FIG. 7. For a 200 mm substrate, preferably at least twenty-four connectors 776 are spaced equally over 360°. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contact pads 772 and the substrate stiffness. Similarly, while less than twenty-four connectors 776 may be used, current flow is increasingly restricted and localized, leading to poor plating results. Since the dimensions of the process cell can be configured to suit a particular application. For example, the dimensions would be changed to compensate between a 200 and a 300 mm substrate.

Figure 10:
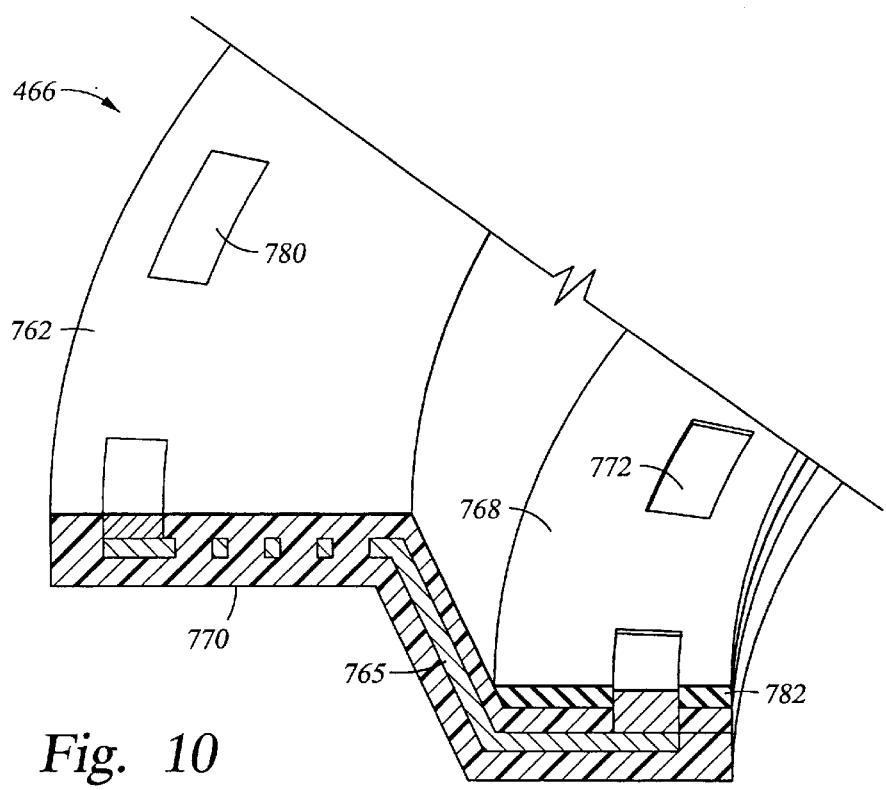
FIG. 10 is a cross sectional perspective view of the FIG. 6 cathode contact ring showing an embodiment of isolation gasket.

As shown in FIG. 10, the substrate seating surface 768 comprises an isolation gasket 782. The isolation gasket is disposed on the insulative body 770 and extends diametrically interior to the inner contact pads 772 to define the inner diameter of the contact ring 466. The isolation gasket 782 preferably extends slightly above the inner contact pads 772, e.g., a few mils, and preferably comprises an elastomer such as VITON® (a registered trademark of the E.I. duPont de Nemours and Company of Wilmington, Del.), TEFLON® (a registered trademark of the E.I. duPont de Nemours and Company of Wilmington, Del.), buna rubber and the like. Where the insulative body 770 also comprises an elastomer the isolation gasket 782 may be of the same material. In the latter embodiment, the isolation gasket 782 and the insulative body 770 may be monolithic, i e., formed as a single piece. However, the isolation gasket 782 is preferably separate from the insulative body 770 so that it may be easily removed for replacement or cleaning.

While FIG. 10 shows a preferred embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contact pads 772 that may be advantageous where material costs are significant such as when the inner contact pads 772 comprise gold.

During processing, the isolation gasket 782 maintains contact with a peripheral portion of the substrate plating surface and is compressed to provide a seal between the remaining electric contact element 466 and the substrate. The seal prevents the electrolyte solution from contacting the edge and backside of the substrate. As noted above, maintaining a clean contact surface is necessary to achieving high plating repeatability. Previous contact ring designs did not provide consistent plating results because contact surface topography varied over time. The contact ring limits, or substantially minimizes, deposits which would otherwise accumulate on the inner contact pads 772 and change their characteristics thereby producing highly repeatable, consistent, and uniform plating across the substrate plating surface.

Figure 11:
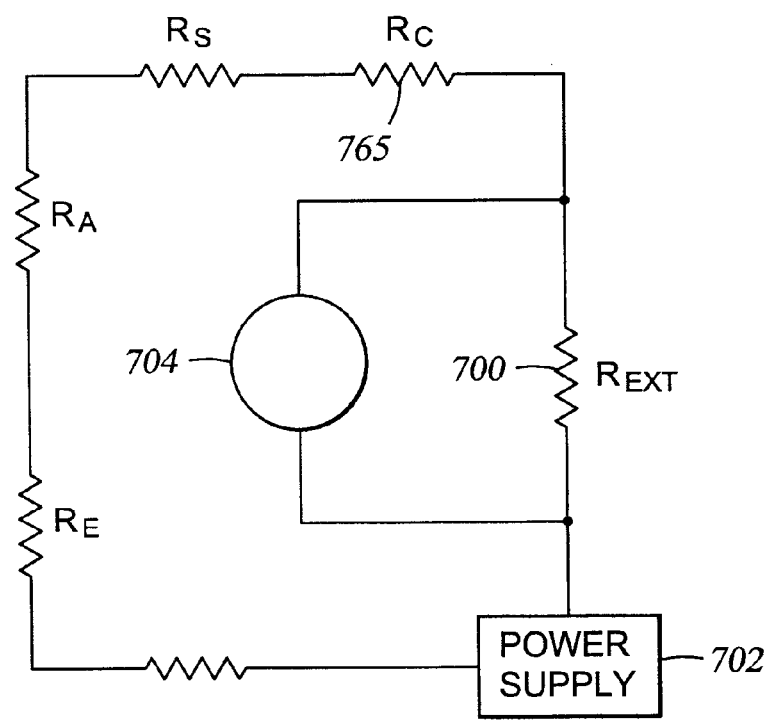
FIG. 11 is a simplified schematic diagram of the electrical circuit representing the electroplating system through each contact.

FIG. 11 is a simplified schematic diagram representing a possible configuration of the electrical circuit for the contact ring 466. To provide a uniform current distribution between the conducting members 765, an external resistor 700 is connected in series with each of the conducting members 765. Preferably, the resistance value of the external resistor 700, represented as $R_{EXT}$, is much greater than the resistance of any other component of the circuit. As shown in FIG. 11, the electrical circuit through each conducting member 765 is represented by the resistance of each of the components connected in series with the power supply 702. $R_E$ represents the resistance of the electrolyte solution, which is typically dependent on the distance between the anode and the cathode contact ring and the chemical composition of the electrolyte solution. Thus, $R_A$ represents the resistance of the electrolyte solution adjacent the substrate plating surface 754. $R_S$ represents the resistance of the substrate plating surface 754, and $R_C$ represents the resistance of the cathode conducting members 765 plus the constriction resistance resulting at the interface between the inner contact pads 772 and the substrate plating layer 754. Generally, the resistance value of the external resistor ($R_{EXT}$) is at least as much as $\Sigma R$, where $\Sigma R$ equals the sum of $R_E$, $R_A$, $R_S$ and $R_C$. Preferably, the resistance value of the external resistor ($R_{EXT}$) is much greater than σR such that $\Sigma R$ is negligible and the resistance of each series circuit approximates $R_{EXT}$.

Typically, one power supply is connected to all of the outer contact pads 780 of the electric contact element 466, resulting in parallel circuits through the inner contact pads 772. However, as the inner contact pad-to-substrate interface resistance varies with each inner contact pad 772, more current will flow, and thus more plating will occur, at the site of lowest resistance. However, by placing an external resistor in series with each conducting member 765, the value or quantity of electrical current passed through each conducting member 765 becomes controlled mainly by the value of the external resistor. As a result, the variations in the electrical properties between each of the inner contact pads 772 do not affect the current distribution on the substrate. The uniform current density applied across the plating surface contributes to a uniform plating thickness of the metal film deposited on the seed layer on the substrate. The external resistors also provide a uniform current distribution between different substrates of a process-sequence.

Although the contact ring 466 is designed to resist deposit buildup on the inner contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contact pads 772 change over time, the VSS processes and analyzes data feedback. The data is compared to pre-established setpoints and the VSS then makes appropriate current and voltage alterations to ensure uniform deposition.

Figure 18:
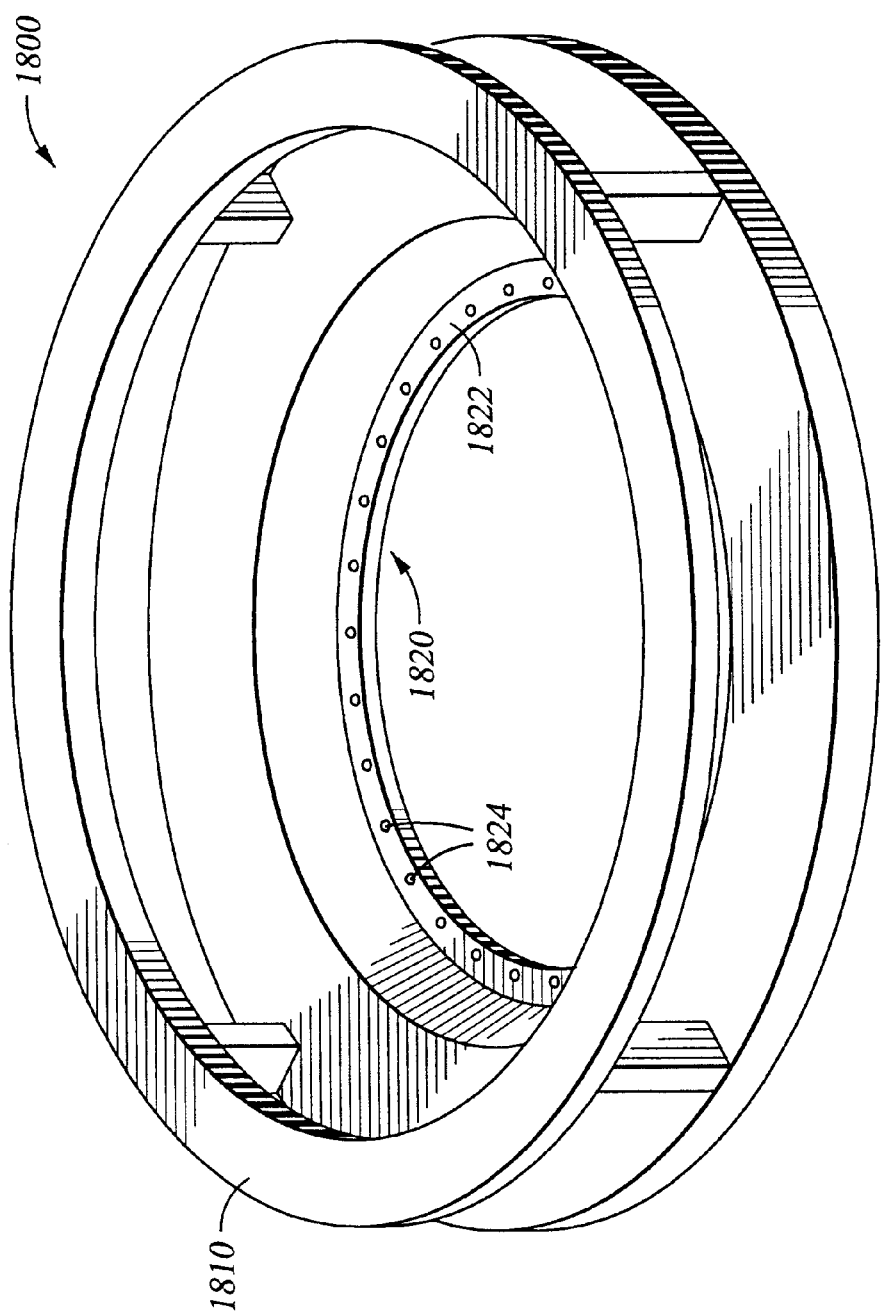
FIG. 18 is a perspective view of an alternative embodiment of a cathode contact ring.

FIG. 18 is a perspective view of an alternative embodiment of a cathode contact ring. The cathode contact ring 1800 as shown in FIG. 18 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the substrate holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electrical contact to the electroplating seed layer on the substrate deposition surface. Preferably, the contact pads 1824 are coated with a noble metal, such as platinum or gold, that is resistant to oxidation.

The exposed surfaces of the cathode contact ring, except the surfaces of the contact pads that come in contact with the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte solution on the surfaces of the cathode contact ring and promotes smooth dripping of the electrolyte solution from the cathode contact ring after the cathode contact ring is removed from the electroplating bath or electrolyte solution. By providing hydrophilic surfaces on the cathode contact ring that facilitate run-off of the electrolyte solution, plating defects caused by residual electrolyte solution on the cathode contact ring are significantly reduced. The inventors also contemplate application of this hydrophilic treatment or coating in other embodiments of cathode contact rings to reduce residual electrolyte solution beading on the cathode contact ring and the plating defects on a subsequently processed substrate that may result therefrom.

Figure 12:
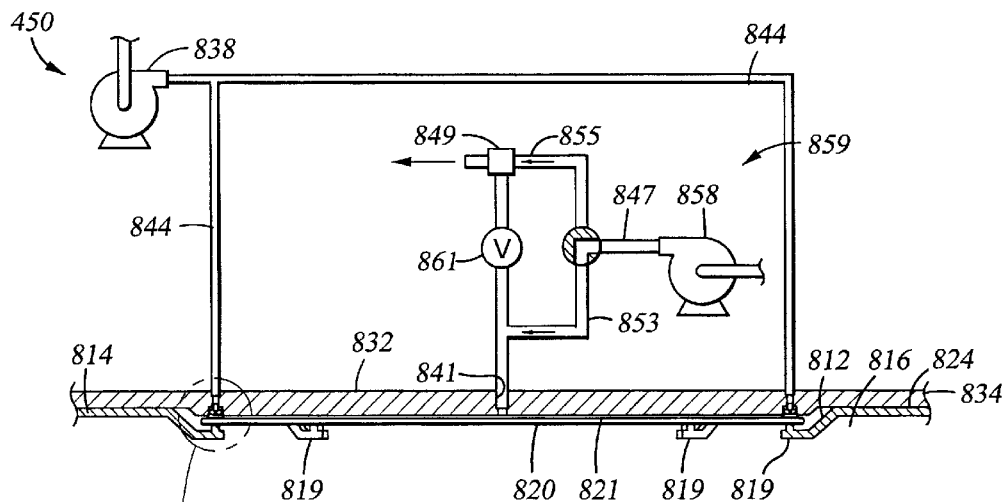
FIG. 12 is a cross sectional view of one embodiment of a substrate assembly.
Figure 12A:
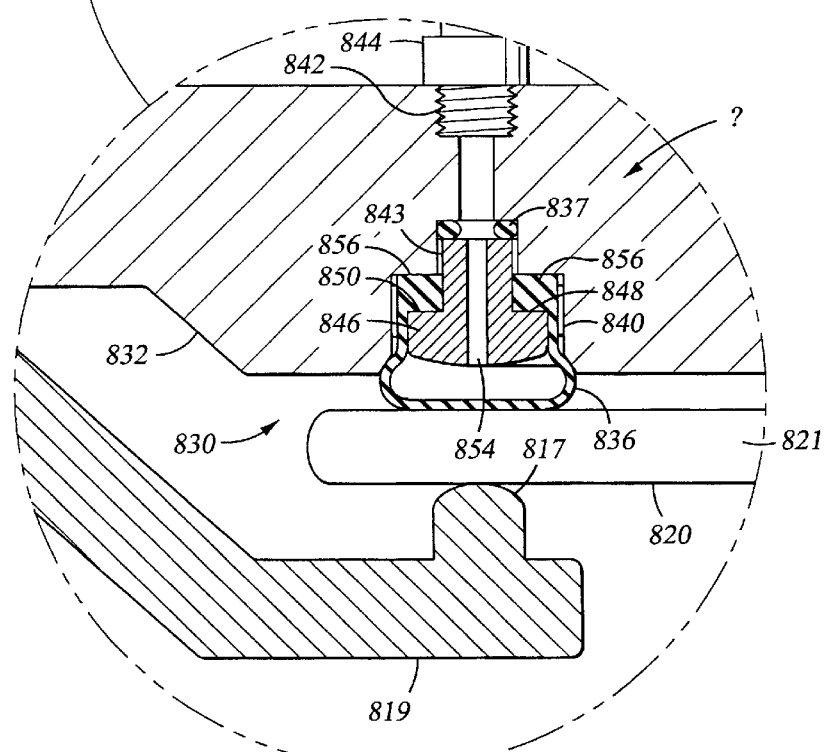
FIG. 12A is an enlarged cross sectional view of an embodiment of a bladder area of FIG. 12.

Referring to FIGS. 12 and 12A, the substrate holder assembly 464 is preferably positioned above the electric contact element 466 and comprises a bladder assembly 470 that provides pressure to the backside of a substrate and ensures electrical contact between the substrate plating surface and the electric contact element 466. The inflatable bladder assembly 470 is disposed on a substrate holder plate 832. A bladder 836 disposed on a lower surface of the substrate holder plate 832 is thus located opposite and adjacent to the contacts on the electric contact element 466 with the substrate 821 interposed therebetween. A fluid source 838 supplies a fluid, i.e., a gas or liquid, to the bladder 836 allowing the bladder 836 to be inflated to varying degrees.

Referring now to FIGS. 12, 12A, and 13, the details of the bladder assembly 470 will be discussed. The substrate holder plate 832 is shown as substantially disc-shaped having an annular recess 840 formed on a lower surface and a centrally disposed vacuum port 841. One or more inlets 842 are formed in the substrate holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849 commonly known as a venturi. One vacuum ejector that may be used is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 which selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The desired direction of fluid flow is indicated by arrows.

Where the fluid source 838 is a gas supply it may be coupled to hose 851 thereby eliminating the need for a separate compressed gas supply, i.e., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Figure 14:
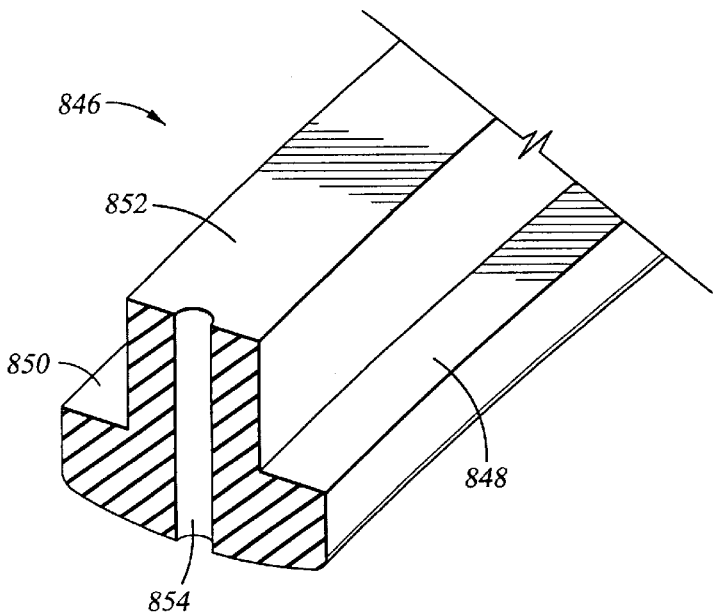
FIG. 14 is a partial cross sectional view of one embodiment of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the substrate holder plate 832 to ensure an airtight seal. Conventional fasteners such as screws may be used to secure the manifold 846 to the substrate holder plate 832 via cooperating threaded bores formed in the manifold 846 and the substrate holder plate 832.

Figure 15:
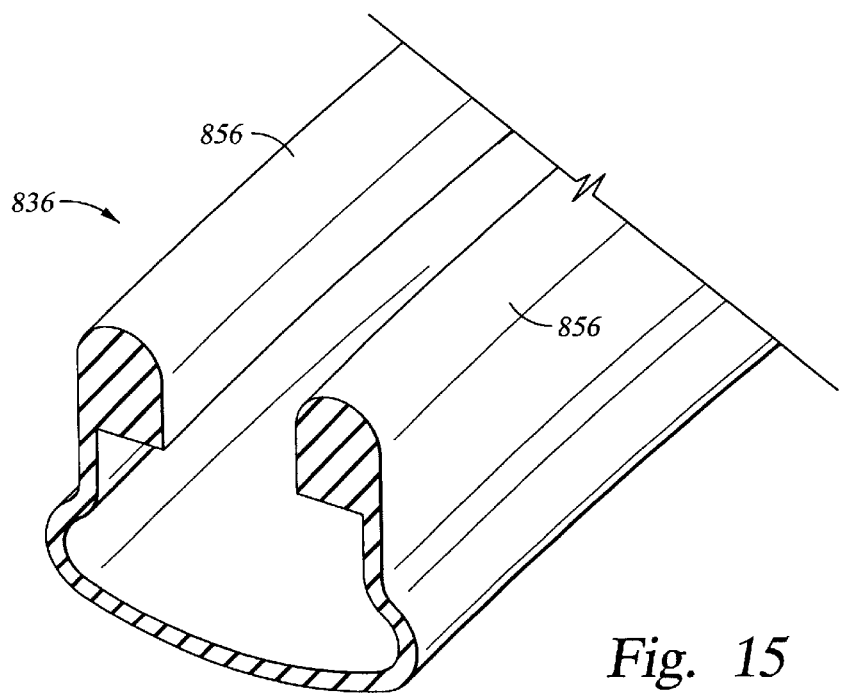
FIG. 15 is a partial cross sectional view of one embodiment of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less, e.g. a few millimeters, than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer which is chemically inert with respect to the electrolyte solution and exhibits reliable elasticity. Where needed a compliant covering 857 may be disposed over the bladder 836, as shown in FIG. 15, and secured by means of an adhesive or thermal bonding. The covering 857 preferably comprises an elastomer such as VITON®, buna rubber or the like, which may be reinforced by KEVLAR® registered trademark of the E.I. duPont de Nemours and Company of Wilmington, Del.), for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. Preferably, the exposed surface of the bladder 836, if uncovered, and the exposed surface of the covering 857 are coated or treated to provide a hydrophilic surface. This coating promotes dripping and removal of the residual electrolyte solution after the head assembly is lifted above the process cell.

The precise number of inlets 842 and outlets 854 may be varied according to the particular application. For example, while FIG. 12 shows two inlets with corresponding outlets, an alternative embodiment could employ a single fluid inlet that supplies fluid to the bladder 836.

In operation, the substrate 821 is introduced into the container body 802 by securing it to the lower side of the substrate holder plate 832. This is accomplished by engaging the pumping system 159 to evacuate the space between the substrate 821 and the substrate holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the electric contact element 466. The electroplating process is then carried out. Electrolyte solution is then pumped into the process cell 420 toward the substrate 821 to contact the exposed substrate plating surface 820. The power supply provides a negative bias to the substrate plating surface 820 via the electric contact element 466. As the electrolyte solution is flowed across the substrate plating surface 820, ions in the electrolytic solution are attracted to the surface 820 and deposit on the surface 820 to form the desired film.

Because of its flexibility, the bladder 836 deforms to accommodate the asperities of the substrate backside and contacts of the electric contact element 466 thereby mitigating misalignment with the conducting electric contact element 466. The compliant bladder 836 prevents the electrolyte solution from contaminating the backside of the substrate 821 by establishing a fluid tight seal at a portion close to the perimeter of a backside of the substrate 821. Once inflated, a uniform pressure is delivered downward toward the electric contact element 466 to achieve substantially equal force at all points where the substrate 821 and electric contact element 466 interface. The force can be varied as a function of the pressure supplied by the fluid source 838. Further, the effectiveness of the bladder assembly 470 is not dependent on the configuration of the electric contact element 466. For example, while FIG. 12 shows a pin configuration having a plurality of discrete contact points, the electric contact element 466 may also be a continuous surface.

Because the force delivered to the substrate 821 by the bladder 836 is variable, adjustments can be made to the current flow supplied by the contact ring 466. As described above, an oxide layer may form on the electric contact element 466 and act to restrict current flow. However, increasing the pressure of the bladder 836 may counteract the current flow restriction due to oxidation. As the pressure is increased, the malleable oxide layer is compromised and superior contact between the electric contact element 466 and the substrate 821 results. The effectiveness of the bladder 836 in this capacity may be further improved by altering the geometry of the electric contact element 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an off position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may be desirable to provide a backside pressure to the substrate 820 in order to cause a "bowing" effect of the substrate to be processed. Bowing of the substrate may results in superior deposition on the substrate since portions, such as the periphery, of the substrate are displaced by the bowing nearer to the anode than other portions. The bowing may make the metal film deposition more uniform if portions of the seed layer having a lesser current density are displaced closer to the anode to make the electric current density more uniform across the substrate. Thus, pumping system 859 is capable of selectively providing a vacuum or pressure condition to the substrate backside. For a 200 mm substrate, for example, a backside pressure up to 5 psi is preferable to bow the substrate. The degree of bowing is variable according to the pressure supplied by pumping system 859. Because substrates typically exhibit some measure of pliability, a backside pressure causes the substrate to bow or assume a convex shape relative to the upward flow of the electrolyte solution.

Those skilled in the art will readily recognize other embodiments. For example, while FIG. 12A shows a preferred bladder 836 having a surface area sufficient to cover a relatively small perimeter portion of the substrate backside at a diameter substantially equal to the electric contact element 466. The geometric configuration of the bladder assembly 470 can be varied. Thus, the bladder assembly may be constructed using more fluid impervious material to cover an increased surface area of the substrate 821.

Figure 19:
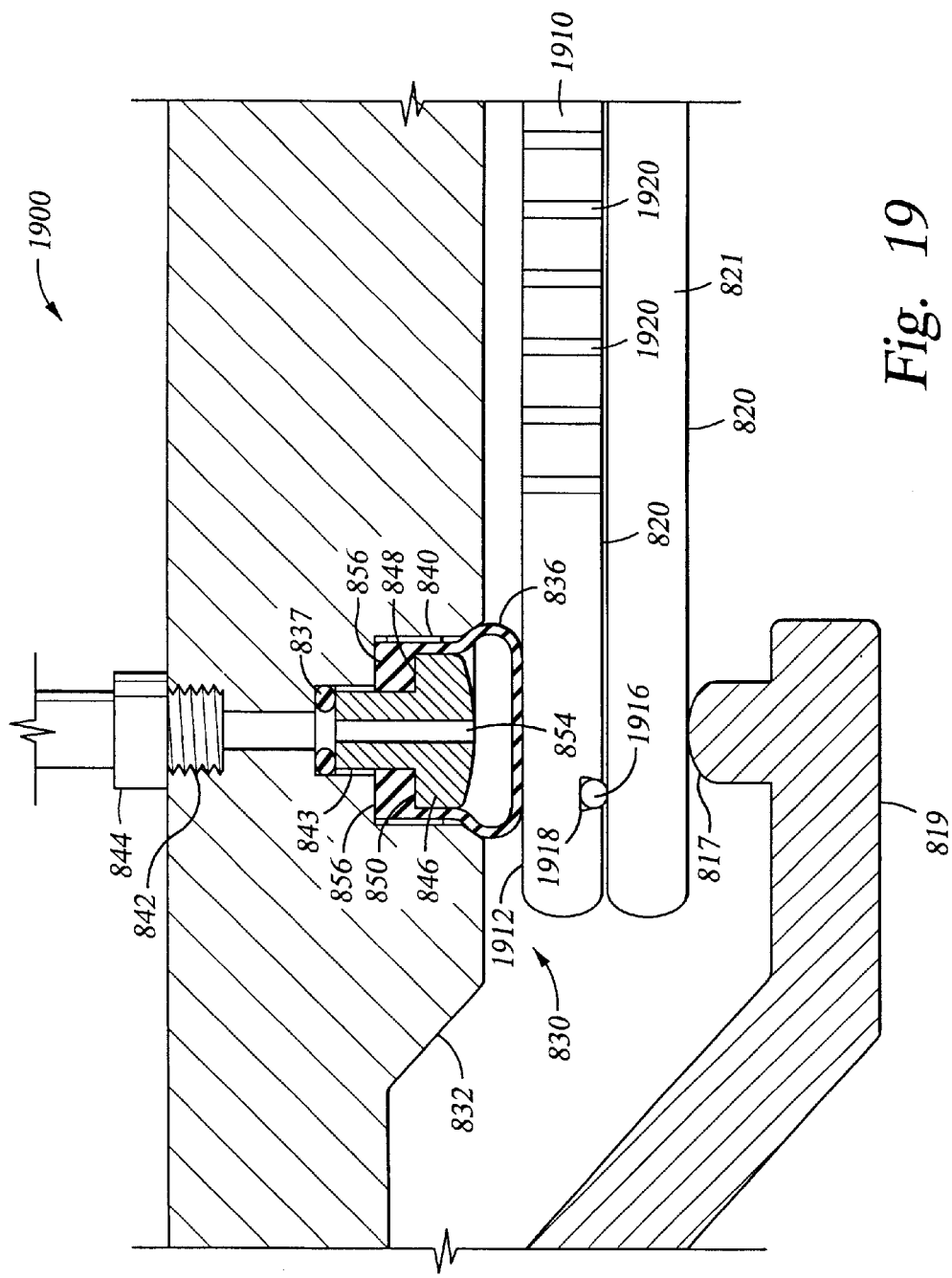
FIG. 19 is a partial cross sectional view of an alternative embodiment of a substrate holder assembly.

FIG. 19 is a partial cross sectional view of an alternative embodiment of a substrate holder assembly. The alternative substrate holder assembly 1900 comprises a bladder assembly 470, as described above, having the inflatable bladder 836 attached to the back surface of an intermediary substrate holder plate 1910. Preferably, a portion of the inflatable bladder 836 is sealingly attached to the back surface 1912 of the intermediary substrate holder plate 1910 using an adhesive or other bonding material. The front surface 1914 of the intermediary substrate holder plate 1910 is adapted to receive a substrate 821 to be processed. An elastomeric o-ring 1916 is disposed in an annular groove 1918 on the front surface 1914 of the intermediary substrate holder plate 1910 to contact a peripheral portion of the substrate back surface. The elastomeric o-ring 1916 provides a seal between the substrate back surface and the front surface of the intermediary substrate holder plate. Preferably, the intermediary substrate holder plate includes a plurality of bores or holes 1920 extending through the plate that are in fluid communication with the vacuum port 841. The plurality of holds 1920 facilitate securing the substrate on the substrate holder plate using a vacuum force applied to the backside of the substrate. According to this alternative embodiment of the substrate holder assembly, the inflatable bladder does not directly contact a substrate being processed, and thus the risk of cutting or damaging the inflatable bladder during substrate transfers is significantly reduced. The elastomeric O-ring 1916 is preferably coated or treated to provide a hydrophilic surface for contacting the substrate. The elastomeric O-ring 1916 is replaced as needed to ensure proper contact and seal to the substrate.

Figure 25:
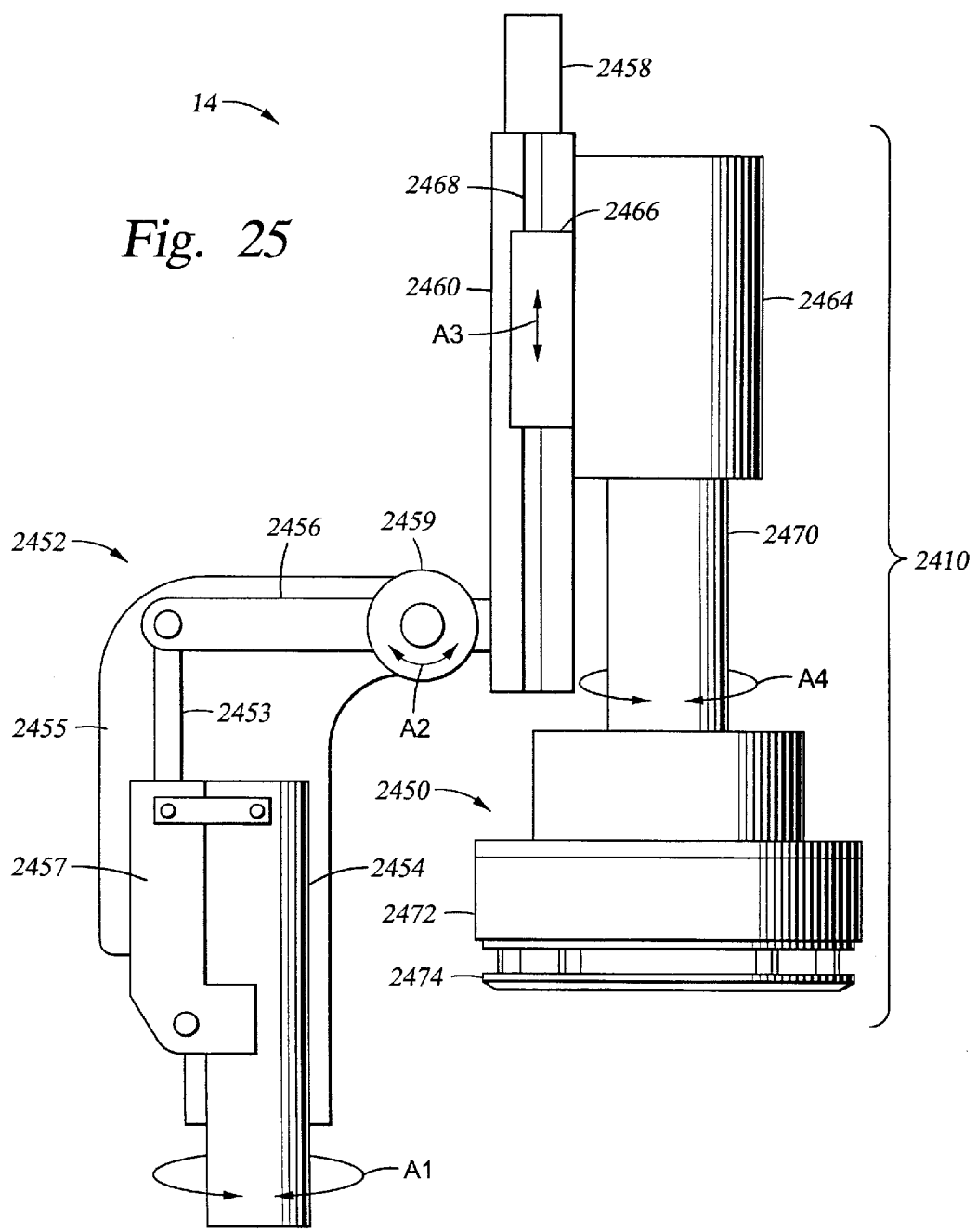
FIG. 25 is an alternative embodiment of a substrate holder sytem having a rotatable head assembly.

FIG. 25 is an alternative embodiment of the process head assembly having a rotatable head assembly 2410. Preferably, a rotational actuator is disposed on the cantilevered arm and attached to the head assembly to rotate the head assembly during substrate processing. The rotatable head assembly 2410 is mounted onto a head assembly frame 2452. The alternative head assembly frame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, S and the post cover 2455 covers a top portion of the mounting post 2454. Preferably, the mounting post 454 provides rotational movement, as indicated by arrow Al, with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on top of the mounting slide 2460 to provide vertical displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement, as indicated by arrow A2, of the cantilever arm 2456 with respect to the joint 2459 between the cantilever arm 2456 and the post cover 2454. When the cantilever arm actuator 2457 is retracted, the cantilever arm 2456 moves the head assembly 2410 away from the process cell 420. The movement of the head assembly 2410 provides the spacing required to remove and/or replace the process cell 420 from the electroplating process cell 240. When the cantilever arm actuator 2457 is extended, the cantilever arm 2456 moves the head assembly 2410 toward the process cell 420 to position the substrate in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a lead-screw type shaft that moves the lift guide, as indicated by arrows A3, between various vertical positions. The rotating actuator 2464 is connected to the substrate holder assembly 2450 through the shaft 2470 and rotates the substrate holder assembly 2450, as indicated by arrows A4. The substrate holder assembly 2450 includes a bladder assembly, such as the embodiments described above with respect to FIGS. 12–15 and 19, and a cathode contact ring, such as the embodiments described above with respect to FIGS. 7–10 and 18.

The rotation of the substrate during the electroplating process generally enhances the deposition results. Preferably, the head assembly is rotated between about 2 rpm and about 200 rpm, preferably between about 20 and 40 rpm, during the electroplating process. The substrate holder assembly 2472 can be rotated to impart rotation to the substrate as the substrate holder system 14 immerses by lowering the seed layer on the substrate into contact with the electrolyte solution in the process cell. The head assembly is raised to remove the seed layer on the substrate from the electrolyte solution in the process cell. The head assembly is preferably rotated at a high speed, i.e. between about 100 and about 2500 rpm, after the head assembly is lifted from the process cell to enhance removal of residual electrolyte solution from the head assembly by centrifugal force.

In one embodiment, the uniformity of the deposited film has been improved within about 2%, i.e., maximum deviation of deposited film thickness is at about 2% of the average film thickness, while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the chemicals in the electrolyte solution, electrolyte solution flow and other parameters.

Referring back to FIG. 6, a cross sectional view of an electroplating process cell 400, the substrate holder assembly 450 is positioned above the process cell 420. The process cell 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, PLEXIGLAS® (acrylic), lexane, PVC, CPVC, and PVDF. Alternatively, the container body 472 can be made from a coated metal, such as stainless steel, nickel and titanium. The coated metal is coated with an insulating layer such as TEFLONE (a trademark of the E. I. duPont de Nemoirs Company of Wilmington, Del.), PVDF, plastic, rubber and other combinations of materials that do not dissolve in the electrolyte solution. The insulating layer can be electrically insulated from the electrodes, i.e., the anode and cathode of the ECP system. The container body 472 is preferably sized and adapted to conform to the substrate plating surface and the shape of the of a substrate being processed through the system, typically circular or rectangular in shape. One preferred embodiment of the container body 472 comprises a cylindrical ceramic tube having an inner diameter that has about the same dimension as or slightly larger than the substrate diameter. Rotational movement typically required in typical ECP systems is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte solution collector 440 and allows the electrolyte solution to flow into the electrolyte solution collector 440. The upper surface of the weir 478 preferably matches the lower surface of the electric contact element 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472. A gap for electrolyte solution flow is formed between the lower surface of the electric contact element 466 and the upper surface of the weir 478. The lower surface of the electric contact element 466 is disposed above the inner flat portion 480 and the middle inclined portion of the weir 478. The outer declined portion 484 is sloped downwardly to facilitate flow of the electrolyte solution into the electrolyte solution collector 440.

A lower portion of the container body 472 extends radially outwardly to form a lower annular flange 486 for securing the container body 472 to the bowl 430. The outer dimension, i.e., circumference, of the annular flange 486 is smaller than the dimensions of the opening 444 and the inner circumference of the electrolyte solution collector 440. The smaller dimension of the annular flange to allow removal and replacement of the process cell 420 from the electroplating process cell 400. Preferably, multiple bolts 488 are fixedly disposed on the annular flange 486 and extend downwardly through matching bolt holes on the bowl 430. A plurality of removable fastener nuts 490 secures the process cell 420 onto the bowl 430. A seal 487, such as an elastomer O-ring, is disposed between container body 472 and the bowl 430 radially inwardly from the bolts 488 to prevent leaks from the process cell 420. The nuts/bolts combination facilitates fast and easy removal and replacement of the components of the process cell 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal ion source in the electrolyte solution. Alternatively, the anode assembly 474 comprises a non-consumable anode, and the metal ions to be electroplated are supplied within the electrolyte solution from the electrolyte solution replenishing system 220. As shown in FIG. 6, the anode assembly 474 is a self-enclosed module having a porous anode enclosure 494 preferably made of the same metal as the metal ions to be electroplated, such as copper. Alternatively, the anode enclosure 494 is made of porous materials, such as ceramics or polymeric membranes. A soluble metal 496, such as high purity copper for electrochemical plating of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable, i.e., soluble, anode provides gas-generation-free electrolyte solution and minimizes the need to constantly replenish the metal ions contained in the electrolyte solution.

An anode electrode contact 498 is inserted through the anode enclosure 494 to provide electrical connection to the soluble metal 496 from a power supply. Preferably, the anode electrode contact 498 is made from a conductive material that is insoluble in the electrolyte solution, such as titanium, platinum and platinum-coated stainless steel. The anode electrode contact 498 extends through the bowl 430 and is connected to an electrical power supply. Preferably, the anode electrical contact 498 includes a threaded portion 497 for a fastener nut 499 to secure the anode electrical contact 498 to the bowl 430, and a seal 495 such as a elastomer washer. The washer is disposed between the fastener nut 499 and the bowl 430 to prevent leaks from the process cell 420.

One embodiment of the chemical reactions that occur in the embodiment of ECP system shown in FIG. 6 may be subdivided into whether a positive bias is applied between the anode and the seed layer to effect plating metal film on the substrate, or whether a negative bias is applied between the anode and the seed layer to effect deplating metal film on the substrate. If a sufficient positive bias is being applied so the voltage of the seed layer is below the voltage of the anode to effect plating on the substrate the following exemplary chemical reactions occur:

Anode chemical reaction

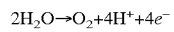
$$2H_2O \rightarrow O_2 + 4H^+ + 4e^-$$

Cathode (seed layer) chemical reaction

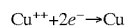
$$Cu^{++} + 2e^- \rightarrow Cu$$

If a sufficient negative bias is applied so the voltage of the seed layer exceeds the voltage of the anode by a sufficient level to effect deplating copper from the seed layer, the following exemplary chemical reactions occur:

Anode chemical reaction

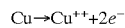
$$Cu \rightarrow Cu^{++} + 2e^-$$

Cathode (seed layer) chemical reaction

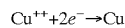
$$Cu^{++} + 2e^- \rightarrow Cu$$

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. Bolts 488 are inserted through the holes 508, and the fastener nuts 490 are fastened onto the bolts 488 that secure the upper annular flange 506 of the bowl 430 to the lower annular flange 486 of the container body 472. Preferably, the outer dimension, i.e., circumference, of the upper annular flange 506 is about the same as the outer dimension, i.e., circumference, of the lower annular flange 486. Preferably, the lower surface of the upper annular flange 506 of the bowl 430 rests on a support flange of the mainframe 214 when the process cell 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502. These relative dimensions force a substantial portion of the electrolyte solution to flow through the anode assembly 474 first before flowing through the filter 476. The bottom portion 504 of the bowl 430 includes an electrolyte solution inlet 510 that connects to an electrolyte solution supply line from the electrolyte solution replenishing system 220. Preferably, the anode assembly 474 is disposed about a middle portion of the cylindrical portion 502 of the bowl 430. The anode assembly 474 is configured to provide a gap for electrolyte solution flow between the anode assembly 474 and the electrolyte solution inlet 510 on the bottom portion 504.

The electrolyte solution inlet 510 and the electrolyte solution supply line are preferably connected by a releasable connector that facilitates easy removal and replacement of the process cell 420. When the process cell 420 needs maintenance, the electrolyte solution is drained from the process cell 420, and the electrolyte solution flow in the electrolyte solution supply line is discontinued and drained. The connector for the electrolyte solution supply line is released from the electrolyte solution inlet 510, and the electrical connection to the anode assembly 474 is also disconnected. The head assembly 410 is raised or rotated to provide clearance for removal of the process cell 420. The process cell 420 is then removed from the mainframe 214, and a new or reconditioned process cell is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 20:
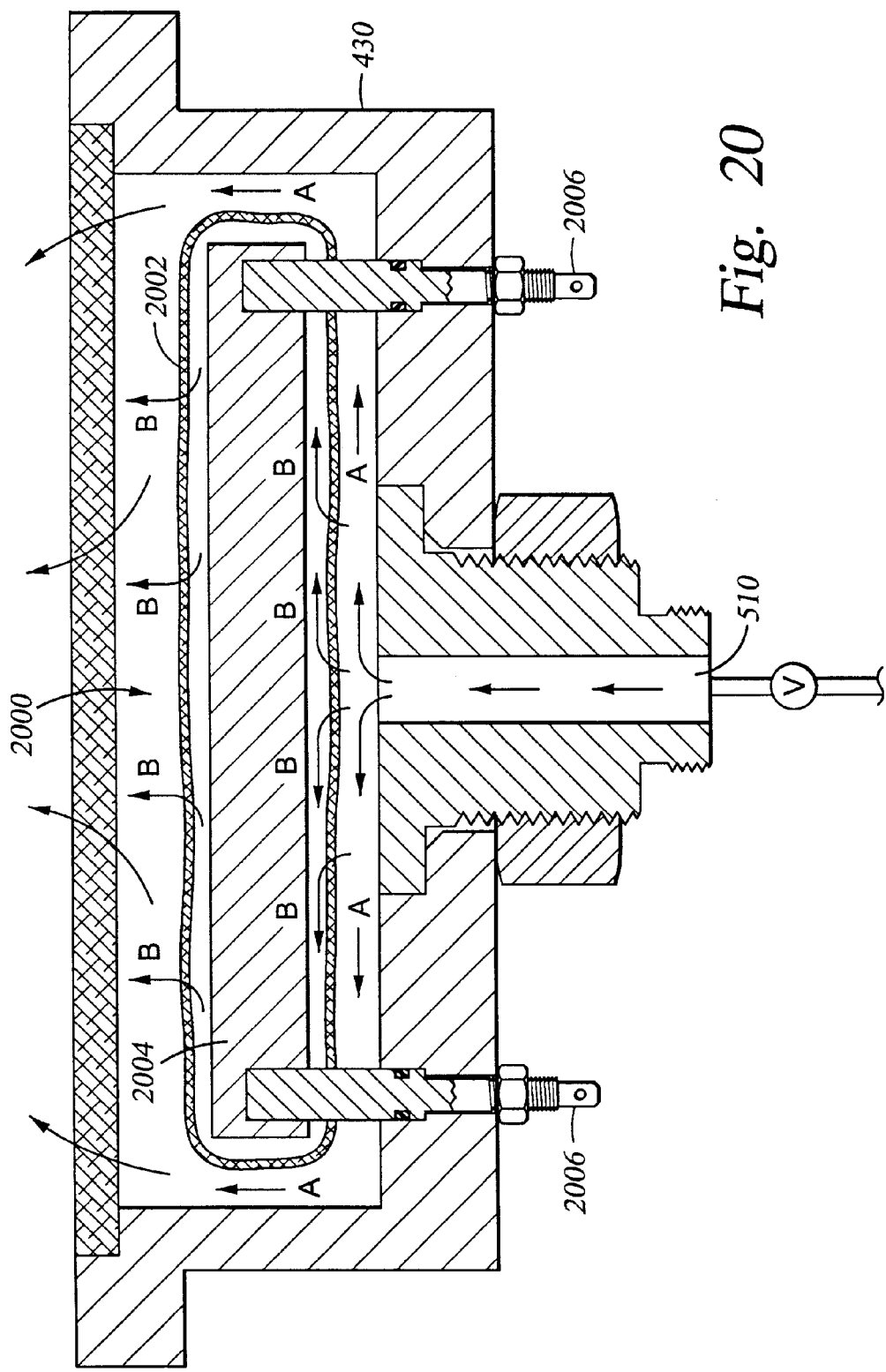
FIG. 20 is a cross sectional view of a one embodiment of an encapsulated anode.

FIG. 20 is a cross sectional view of one embodiment of an encapsulated anode. The encapsulated anode 2000 includes a permeable anode enclosure that filters or traps "anode sludge" or particulates generated by the anode as a waste product. As shown in FIG. 20, the anode plate 2004 comprises a solid piece of copper. Preferably, the anode plate 2004 is a high purity, oxygen free copper, enclosed in a hydrophilic anode encapsulation membrane 2002. The anode plate 2004 is secured and supported by a plurality of electrical contacts or feed-throughs 2006 that extend through the bottom of the bowl 430. The electrical contacts or feed-throughs 2006 extend through the anode encapsulation membrane 2002 into the bottom surface of the anode plate 2004. The flow of the electrolyte solution, as indicated by the arrow A, from the electrolyte solution inlet 510 disposed at the bottom of the bowl 430 through the gap between the anode and the bowl sidewall. The electrolyte solution also flows through the anode encapsulation membrane 2002 by permeation into and out of the gap between the anode encapsulation membrane and the anode plate, as indicated by the arrow B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 $\mu$m and about 1 $\mu$m, more preferably between about 0.1 $\mu$m and about 0.2 $\mu$m. One example of a hydrophilic porous membrane is the Durapore Hydrophilic Membrane, available from Millipore Corporation, located in Bedford, Mass. As the electrolyte solution flows through the encapsulation membrane, anode sludge and particulates generated by the dissolving anode are filtered or trapped by the encapsulation membrane. Thus, the encapsulation membranes improve the purity of the electrolyte solution during the electroplating process, and defect formations on the substrate during the electroplating process caused by anode sludge and contaminant particulates are significantly reduced.

Figure 21:
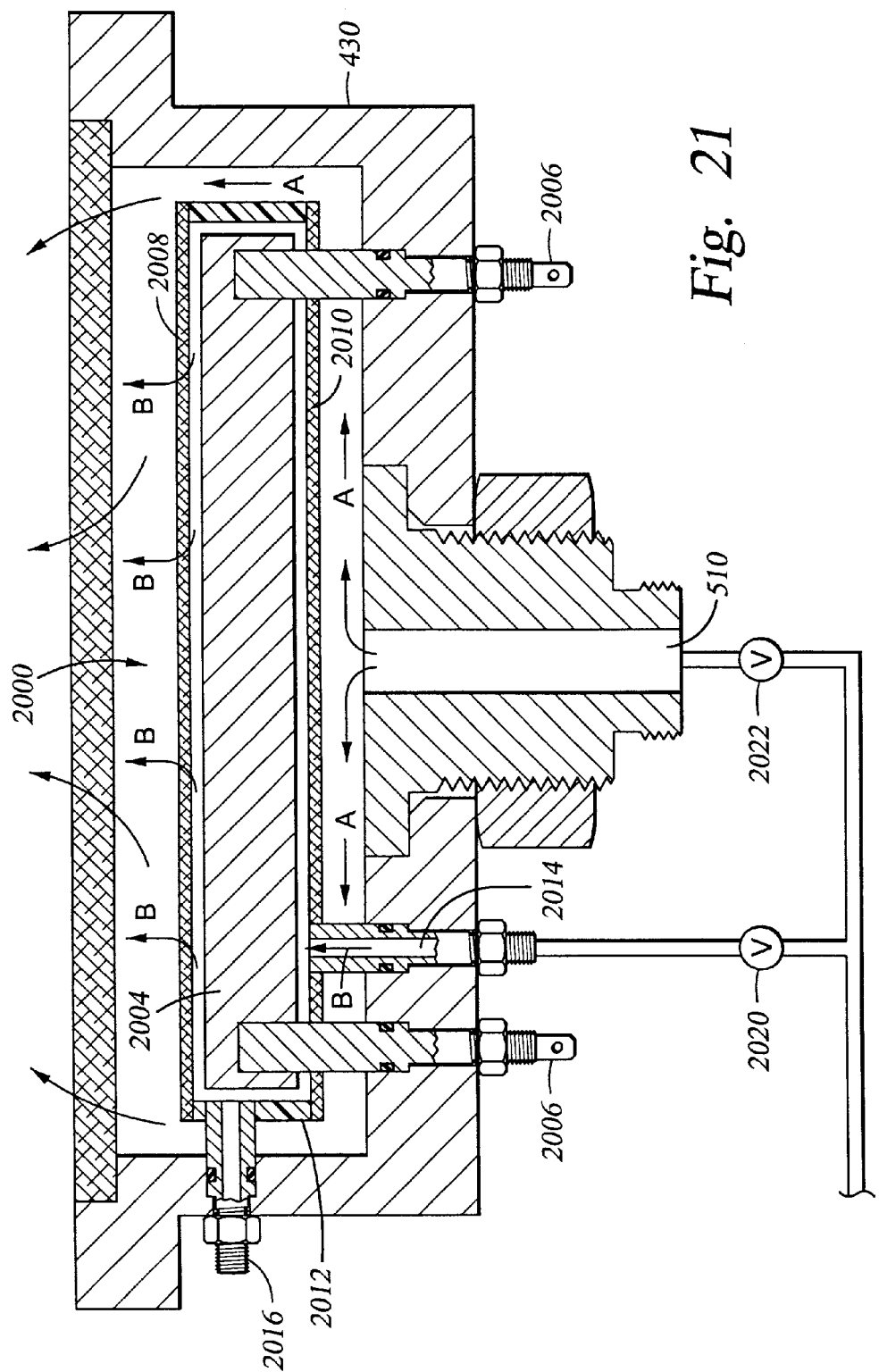
FIG. 21 is a cross sectional view of another embodiment of an encapsulated anode.

FIG. 21 is a cross sectional view of another embodiment of an encapsulated anode. The anode plate 2004 is secured and supported on the electrical feed-throughs 2006. A top encapsulation membrane 2008 and a bottom encapsulation membrane 2010, disposed respectively above and below the anode plate 2004, are attached to a membrane support ring 2012 that is disposed around the anode plate 2004. The top and bottom encapsulation membranes 2008, 2010 comprise a material from the list above. The membrane support ring 2012 preferably comprises a relatively rigid material as compared to the encapsulation membrane, such as plastic or other polymers. A bypass fluid inlet 2014 is disposed through the bottom of the bowl 430 and through the bottom encapsulation membrane 2010 to introduce electrolyte solution into the gap between the encapsulation membranes and the anode plate. A bypass outlet 2016 is connected to the membrane support ring 2012 and extends through the bowl 430 to facilitate flow of excess electrolyte solution with the anode sludge or generated particulates out of the encapsulated anode into a waste drain, not shown.

Preferably, the electrolyte solution flows within the bypass fluid inlet 2014 and the main electrolyte solution inlet 510 are individually controlled by flow control valves 2020, 2022. The individual flow control valves 2020, 2022 are respectively placed along the fluid lines connected to the inlets. The fluid pressure in the bypass fluid inlet 2014 is preferably maintained at a higher pressure than the pressure in the main electrolyte solution inlet 510. The flow of the electrolyte solution inside the bowl 430 from the main electrolyte solution inlet 510 is indicated by arrows A, and the flow of the electrolyte solution inside the encapsulated anode 2000 is indicated by the arrows B. A portion of the electrolyte solution introduced into the encapsulated anode flows out of the encapsulated anode through the bypass outlet 2016. By providing a dedicated bypass electrolyte solution supply into the encapsulated anode, the anode sludge or particulates generated from the dissolving anode is continually removed from the anode, thereby improving the purity of the electrolyte solution during the electroplating process.

Figure 22:
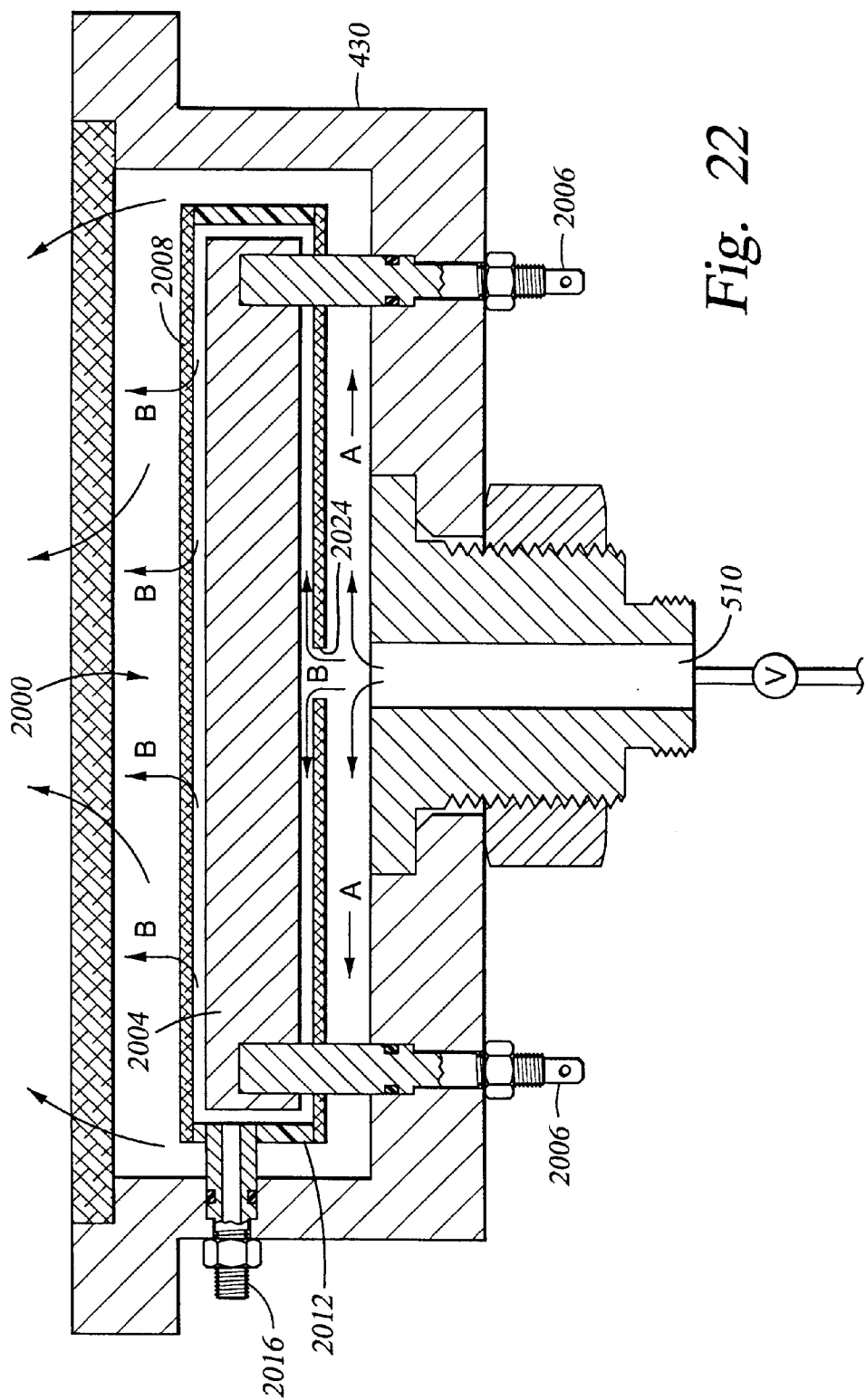
FIG. 22 is a cross sectional view of another embodiment of an encapsulated anode.

FIG. 22 is a cross sectional view of yet another embodiment of an encapsulated anode. This embodiment of an encapsulated anode 2000 includes an anode plate 2004, a plurality of electrical feed-throughs 2006, a top encapsulation membrane 2008, a bottom encapsulation membrane 2010, a membrane support ring 2012, and a bypass outlet 2016. The anode plate 2004 is secured and supported on the plurality of electrical feed-throughs 2006. The top and a bottom encapsulation membrane 2008, 2010 are attached to a membrane support ring 2012. The bypass outlet 2016 is connected to the membrane support ring 2012 and extends through the bowl 430. This embodiment of an encapsulated anode preferably comprises materials as described above for the previous-described embodiments of an encapsulated anode. The bottom encapsulation membrane 2010 includes one or more openings 2024 disposed substantially above the main electrolyte solution inlet 510. Each opening 2024 is adapted to receive flow of electrolyte solution from the main electrolyte solution inlet 510 and is preferably about the same size as the internal circumference of the main electrolyte solution inlet 510. The flow of the electrolyte solution from the main electrolyte solution inlet 510, indicated by the arrow A, and the flow of the electrolyte solution within the encapsulated anode, indicated by the arrow B. A portion of the electrolyte solution flows out of the encapsulated anode through the bypass outlet 2016, carrying a portion of the anode sludge and particulates generated from anode dissolution.

Figure 23:
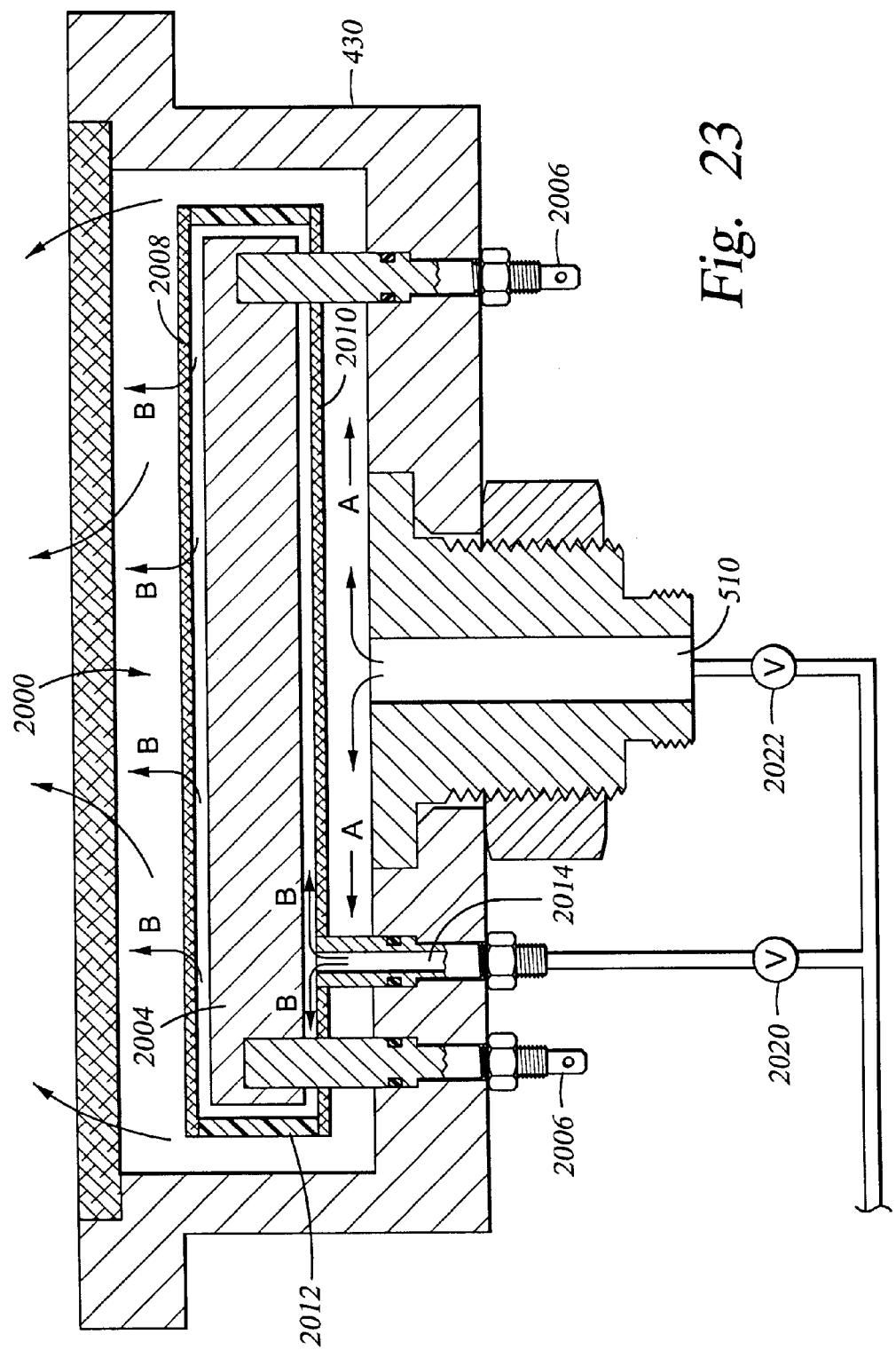
FIG. 23 is a cross sectional view of yet another embodiment of an encapsulated anode.

FIG. 23 is a cross sectional view of another embodiment of an encapsulated anode. This embodiment of an encapsulated anode 2000 includes an anode plate 2002, a plurality of electrical feed-throughs 2006, a top encapsulation membrane 2008, a bottom encapsulation membrane 2010, a membrane support ring 2012, and a bypass fluid inlet 2014. The anode plate 2002 is secured and supported on a plurality of electrical feed-throughs 2006. The top and bottom encapsulation membranes 2008, 2010 are attached to a membrane support ring 2012. A bypass fluid inlet 2014 is disposed through the bottom of the bowl 430 and through the bottom encapsulation membrane 2010 to introduce electrolyte solution into the gap between the encapsulation membranes and the anode plate. This embodiment of an encapsulated anode preferably comprises materials as described above for the above-described embodiments of an encapsulated anode. Preferably, the electrolyte solution flows through the bypass fluid inlet 2014 and the main electrolyte solution inlet 510 are individually controlled by control valves 2020, 2022, respectively. The flow of the electrolyte solution from the main electrolyte solution inlet 510 is indicated by the arrows A. The flow of the electrolyte solution through the encapsulated anode is indicated by arrow B. For this embodiment, the anode sludge and particulates generated by the dissolving anode plate are filtered and trapped by the encapsulation membranes as the electrolyte solution passes through the membrane.

Figure 16:
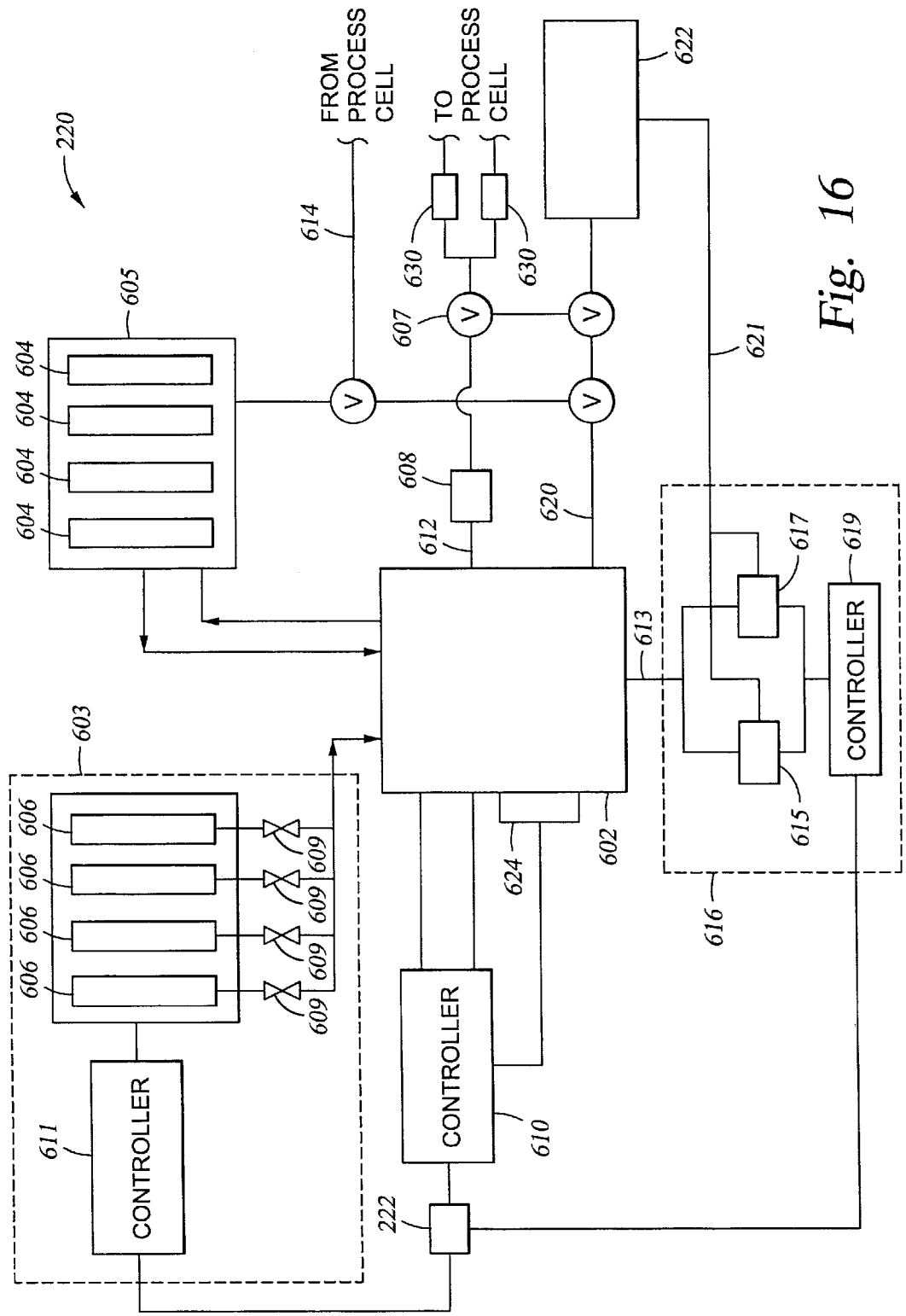
FIG. 16 is a schematic diagram of one embodiment of an electrolyte replenishing system.

FIG. 16 is a schematic diagram of an electrolyte solution replenishing system 220. The electrolyte solution replenishing system 220 provides the electrolyte solution to the electroplating process cells for the electroplating process. The electrolyte solution replenishing system 220 generally comprises a main electrolyte solution tank 602, a dosing module 603, a filtration module 605, a chemical analyzer module 616, and an electrolyte solution waste disposal system 622. The electrolyte solution waste disposal system 622 is connected to the analyzing module 616 by an electrolyte solution waste drain 620. One or more controllers control the composition of the electrolyte solution in the main tank 602 and the operation of the electrolyte solution replenishing system 220. Preferably, the controllers are independently operable but integrated with the controller 222 of the ECP system 200.

The main electrolyte solution tank 602 provides a reservoir for electrolyte solution and includes an electrolyte solution supply line 612 that is connected to each of the electroplating process cells through one or more fluid pumps 608 and valves 607. A heat exchanger 624 or a heater/chiller disposed in thermal connection with the main tank 602 controls the temperature of the electrolyte solution stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte solution and typically include a deionized water source tank and copper sulfate ($CuSO_4$) source tank for composing the electrolyte solution. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which is preferably connected to the controller 222 to receive signals therefrom.

The electrolyte solution filtration module 605 includes a plurality of filter tanks 604. An electrolyte solution return line 614 is connected between each of the process cells and one or more filter tanks 604. The filter tanks 604 remove the undesired contents in the used electrolyte solution before returning the electrolyte solution to the main tank 602 for re-use. The main tank 602 is also connected to the filter tanks 604 to facilitate re-circulation and filtration of the electrolyte solution in the main tank 602. By re-circulating the electrolyte solution from the main tank 602 through the filter tanks 604, the undesired contents in the electrolyte solution are continuously removed by the filter tanks 604 to maintain a consistent level of purity. Additionally, re-circulating the electrolyte solution between the main tank 602 and the filtration module 605 allows the various chemicals in the electrolyte solution to be thoroughly mixed.

The electrolyte solution replenishing system 220 also includes a chemical analyzer module 616 that provides real-time chemical analysis of the chemical composition of the electrolyte solution. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte solution. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer which may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte solution and by-products resulting from the processing which are returned to the main tank 602 from the process cells.

The analyzer module shown FIG. 16 is merely illustrative. In another embodiment each analyzer may be coupled to the main electrolyte solution tank by a separate supply line and be operated by separate controllers. Persons skilled in the art will recognize other embodiments.

In operation, a sample of electrolyte solution is flowed to the analyzer module 616 via the sample line 613. Although the sample may be taken periodically, preferably a continuous flow of electrolyte solution is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the controller 222. The controller 222 processes the information and transmits signals that include user-defined chemical dosage parameters to the dosing controller 611. The received information is used to provide real-time adjustments to the source chemical replenishment rates by operating one or more of the valves 609. The received information thereby maintains a desired, and preferably constant, chemical composition of the electrolyte solution throughout the electroplating process. The waste electrolyte solution from the analyzer module is then flowed to the waste disposal system 622 via the outlet line 621.

Although a preferred embodiment utilizes real-time monitoring and adjustments of the electrolyte solution, various alternatives may be employed. For example, the dosing module 603 may be controlled manually by an operator observing the output values provided by the chemical analyzer module 616. Preferably, the system software allows for both an automatic real-time adjustment mode as well as an operator, manual, mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte solution replenishing system 220 also includes an electrolyte solution waste drain 620 connected to an electrolyte solution waste disposal system 622 for safe disposal of used electrolyte solutions, chemicals and other fluids used in the ECP system. Preferably, the electroplating cells include a direct line connection to the electrolyte solution waste drain 620, or the electrolyte solution waste disposal system 622. The electrolyte solution waste drain 620 drains the electroplating cells without returning the electrolyte solution through the electrolyte solution replenishing system 220. The electrolyte solution replenishing system 220 preferably also includes a bleed off connection to bleed off excess electrolyte solution to the electrolyte solution waste drain 620.

Preferably, the electrolyte solution replenishing system 220 also includes one or more degasser modules 630 adapted to remove undesirable gases from the electrolyte solution. The degasser module generally comprises a membrane that separates gases from the fluid passing through the degasser module and a vacuum system for removing the released gases. The degasser modules 630 are preferably placed in line on the electrolyte solution supply line 612 adjacent to the process cells 240. The degasser modules 630 are preferably positioned as close as possible to the process cells 240 so most of the gases from the electrolyte solution replenishing system are removed by the degasser modules before the electrolyte solution enters the process cells. Preferably, each degasser module 630 includes two outlets to supply degassed electrolyte solution to the two process cells 240 of each processing station 218. Alternatively, a degasser module 630 is provided for each process cell. The degasser modules can be placed at many other alternative positions. For example, the degasser module can be placed at other positions in the electrolyte solution replenishing system, such as along with the filter section or in a closed-loop system with the main tank or with the process cell. As another example, one degasser module is placed in line with the electrolyte solution supply line 612 to provide degassed electrolyte solution to all of the process cells 240 of the electrochemical plating system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

Figure 26A:
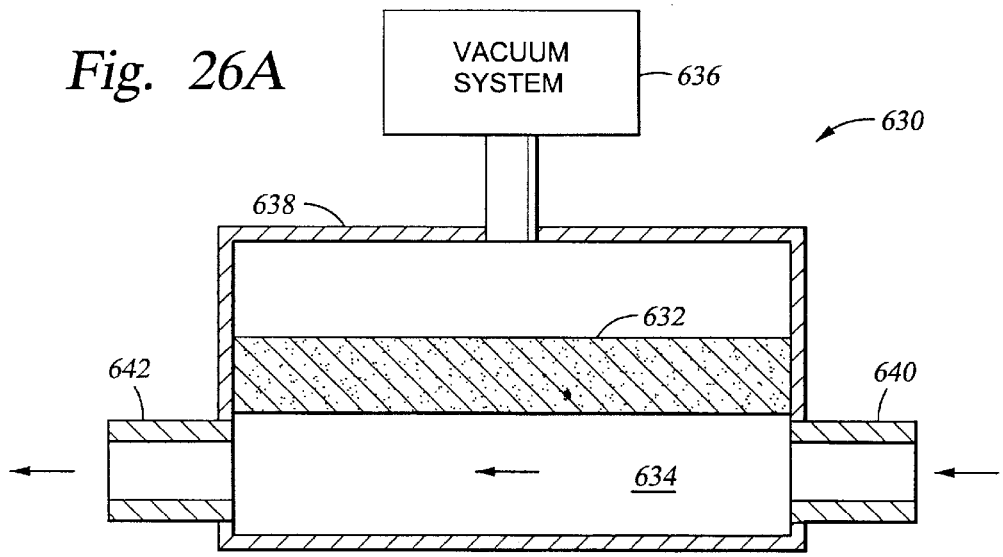
FIGS. 26a and 26b are cross sectional views of embodiments of a degasser module.
Figure 26B:
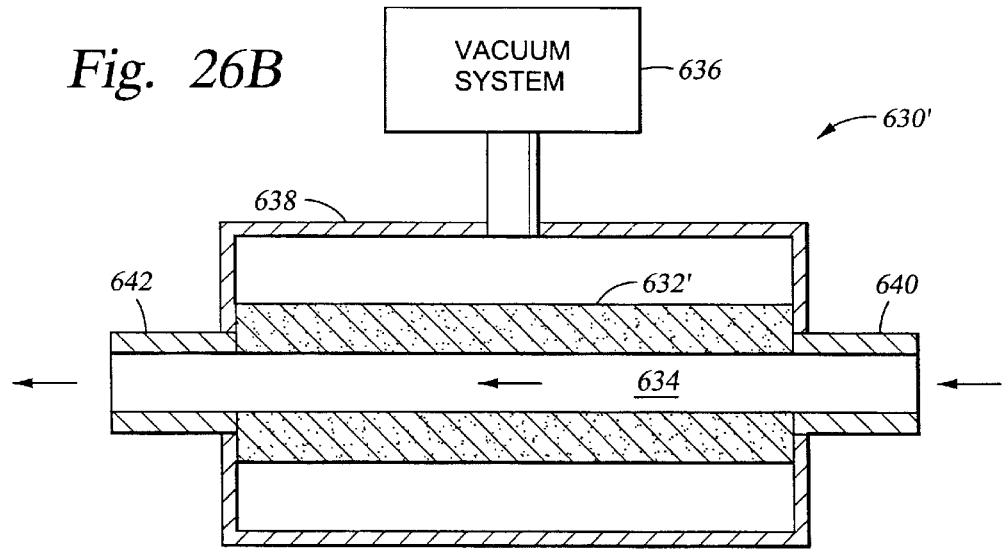

One embodiment of the degasser module 630, as shown in FIG. 26a, includes a hydrophobic membrane 632 having a fluid, i.e., electrolyte solution, passage 634 on one side of the membrane 632. A vacuum system 636 disposed on the opposite side of the membrane. The enclosure 638 of the degasser module includes an inlet 640 and one or more outlets 642. As the electrolyte solution passes through the degasser module 630, the gases and other micro-bubbles in the electrolyte solution are separated from the electrolyte solution through the hydrophobic membrane and removed by the vacuum system. Another embodiment of the degasser module 630', as shown in FIG. 26b, includes a tube of hydrophobic membrane 632' and a vacuum system 636 disposed around the tube of hydrophobic membrane 632'. The electrolyte solution is introduced inside the tube of hydrophobic membrane, and as the electrolyte solution passes through the fluid passage 634 in the tube. The hydrophobic membrane separates gases and other micro-bubbles in the electrolyte solution, and a tube that is connected to the vacuum system 636 removes the separated gasses. More complex designs of degasser modules are contemplated, including designs having serpentine paths of the electrolyte solution across the membrane and other multi-sectioned designs of degasser modules.

Although not shown in FIG. 16, the electrolyte solution replenishing system 220 may include a number of other components. For example, the electrolyte solution replenishing system 220 preferably also includes one or more additional tanks for storage of chemicals for a substrate cleaning system, such as the SRD station. Double-contained piping for hazardous material connections may also be employed to provide safe transport of the chemicals throughout the system. Optionally, the electrolyte solution replenishing system 220 includes connections to additional or external electrolyte solution processing system to provide additional electrolyte solution supplies to the ECP system.

Figure 17:
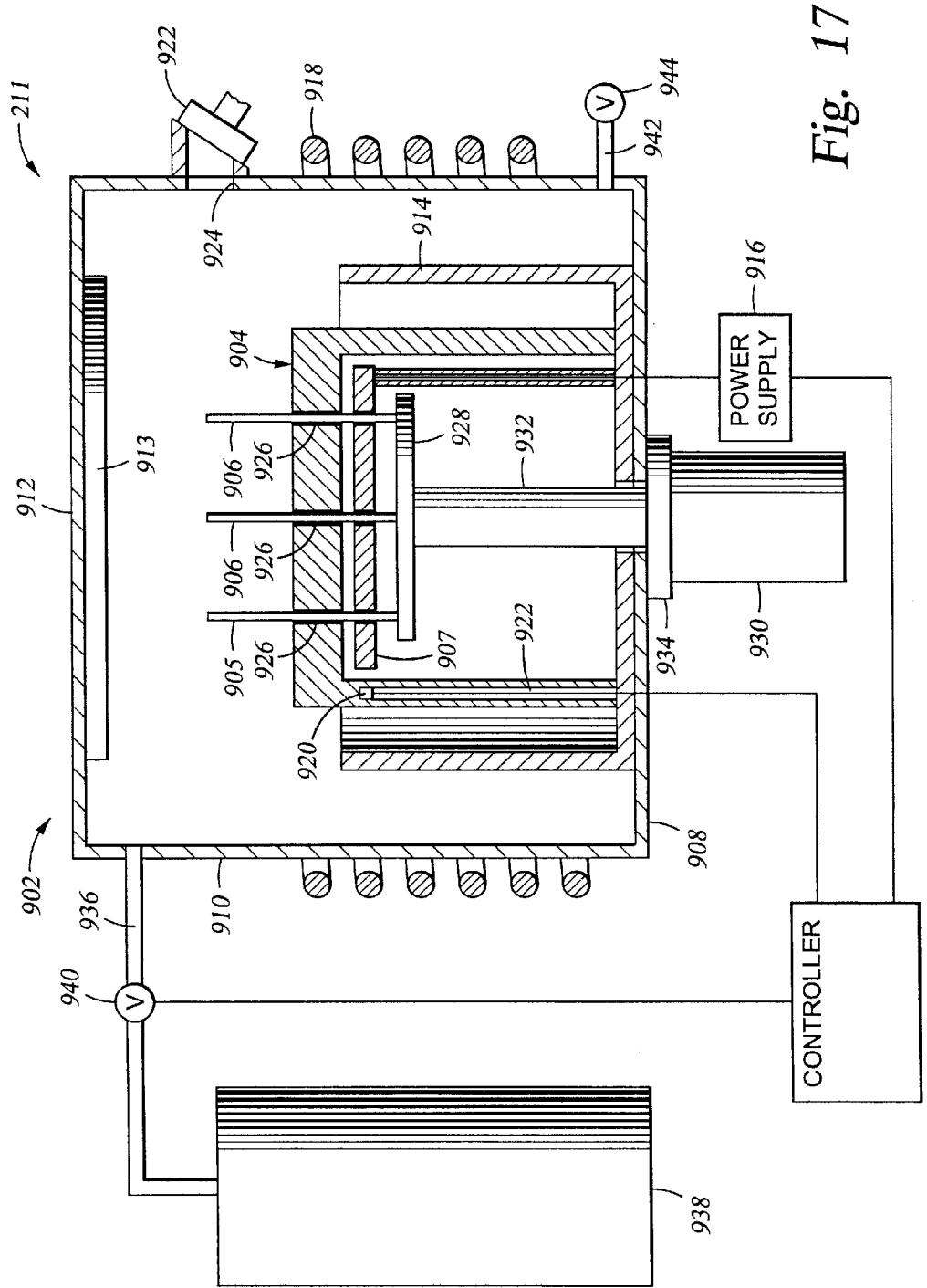
FIG. 17 is a cross sectional view of one embodiment of a rapid thermal anneal chamber.

FIG. 17 is a cross sectional view of an embodiment of rapid thermal anneal (RTA) chamber. The RTA chamber 211 is preferably connected to the loading station 210, and substrates are transferred into and out of the RTA chamber 211 by the loading station transfer robot 228. The ECP system, as shown in FIGS. 2 and 3, preferably comprises two RTA chambers 211 disposed on opposing sides of the loading station 210, corresponding to the symmetric design of the loading station 210. RTA chambers are generally well known in the art, and RTA chambers are typically utilized in substrate processing systems to enhance the properties of the deposited materials. A variety of RTA chamber designs, including hot plate designs and heat lamp designs, may be used to enhance the electroplating results. One RTA chamber is the WXZ chamber available from Applied materials, Inc., located in Santa Clara, Calif. Although this disclosure is described using a hot plate RTA chamber, other types of RTA chambers may be used as well.

Referring back to FIG. 2, the ECP system 200 includes the controller 222 that controls the functions of each component of the platform. Preferably, the controller 222 is mounted above the mainframe 214, and the controller comprises a programmable microprocessor. The programmable microprocessor is typically programmed using a software designed specifically for controlling all components of the ECP system 200. The controller 222 also provides electrical power to the components of the system and includes a control panel 223 that allows an operator to monitor and operate the ECP system 200. The control panel 223, as shown in FIG. 2, is a stand-alone module that is connected to the controller 222 through a cable and provides easy access to an operator. Generally, the controller 222 coordinates the operations of the loading station 210, the RTA chamber 211, the SRD station 212, the mainframe 214 and the processing stations 218. Additionally, the controller 222 coordinates with the controller of the electrolyte solution replenishing system 220 to provide the electrolyte solution for the electroplating process.

The following is a description of a typical substrate electroplating process sequence through the electroplating system platform 200 as shown in FIG. 2. A substrate cassette containing a plurality of substrates is loaded into the substrate cassette receiving areas 224 in the loading station 210 of the electroplating system platform 200. A loading station transfer robot 228 picks up a substrate from a substrate slot in the substrate cassette and places the substrate in the substrate orientor 230. The substrate orientor 230 determines and orients the substrate to a desired orientation for processing through the system. The loading station transfer robot 228 then transfers the oriented substrate from the substrate orientor 230 and positions the substrate in one of the substrate slots in the substrate pass-through cassette 238 in the SRD station 212. The mainframe transfer robot 242 picks up the substrate from the substrate passthrough cassette 238 and positions the substrate for transfer by the flipper robot 248. The flipper robot 248 rotates its robot blade below the substrate and picks up substrate from mainframe transfer robot blade. The vacuum suction gripper on the flipper robot blade secures the substrate on the flipper robot blade, and the flipper robot flips the substrate from a face up position to a face down position. The flipper robot 248 rotates and positions the substrate face down in the substrate holder assembly 450. The substrate is positioned below the substrate holder plate 464 but above the cathode contact ring 466. The flipper robot 248 then releases the substrate to position the substrate into the cathode contact ring 466. The substrate holder plate 464 moves toward the substrate and the vacuum chuck secures the substrate on the substrate holder plate 464. The bladder assembly 470 on the substrate holder assembly 450 exerts pressure against the substrate backside to ensure electrical contact between the substrate plating surface and the cathode contact ring 466.

The head assembly 452 is lowered to a processing position above the process cell 420. At this position the substrate is below the upper plane of the weir 478 and contacts the electrolyte solution contained in the process cell 420. The power supply is activated to supply electrical power, i.e., voltage and current, to the cathode and the anode to enable the electroplating process. The electrolyte solution is typically continually pumped into the process cell during the electroplating process. The electrical power supplied to the cathode and the anode and the flow of the electrolyte solution are controlled by the controller 222 to achieve the desired electroplating results. Preferably, the head assembly is rotated as the head assembly is lowered and also during the electroplating process.

After the electroplating process is completed, the head assembly 410 raises the substrate holder assembly and removes the substrate from the electrolyte solution. Preferably, the head assembly is rotated for a period of time to enhance removal of residual electrolyte solution from the substrate holder assembly. The vacuum chuck and the bladder assembly of the substrate holder assembly then release the substrate from the substrate holder plate. The substrate holder assembly is raised to allow the flipper robot blade to pick up the processed substrate from the cathode contact ring. The flipper robot rotates the flipper robot blade above the backside of the processed substrate in the cathode contact ring and picks up the substrate using the vacuum suction gripper on the flipper robot blade. The flipper robot rotates the flipper robot blade with the substrate out of the substrate holder assembly, flips the substrate from a face-down position to a face-up position, and positions the substrate on the mainframe transfer robot blade. The mainframe transfer robot then transfers and positions the processed substrate above the SRD module 236. The SRD substrate support lifts the substrate, and the mainframe transfer robot blade retracts away from the SRD module 236. The substrate is cleaned in the SRD module using deionized water or a combination of deionized water and a cleaning fluid as described in detail above. The substrate is then positioned for transfer out of the SRD module. The loading station transfer robot 228 picks up the substrate from the SRD module 236 and transfers the processed substrate into the RTA chamber 211 for an anneal treatment process to enhance the properties of the deposited materials. The annealed substrate is then transferred out of the RTA chamber 211 by the loading station robot 228 and placed back into the substrate cassette for removal from the ECP system. The above-described sequence can be carried out for a plurality of substrates substantially simultaneously in the ECP system 200. Also, the ECP system can be adapted to provide multi-stack substrate processing.

2. Flow Diffuser Configuration and Operation

Figure 27:
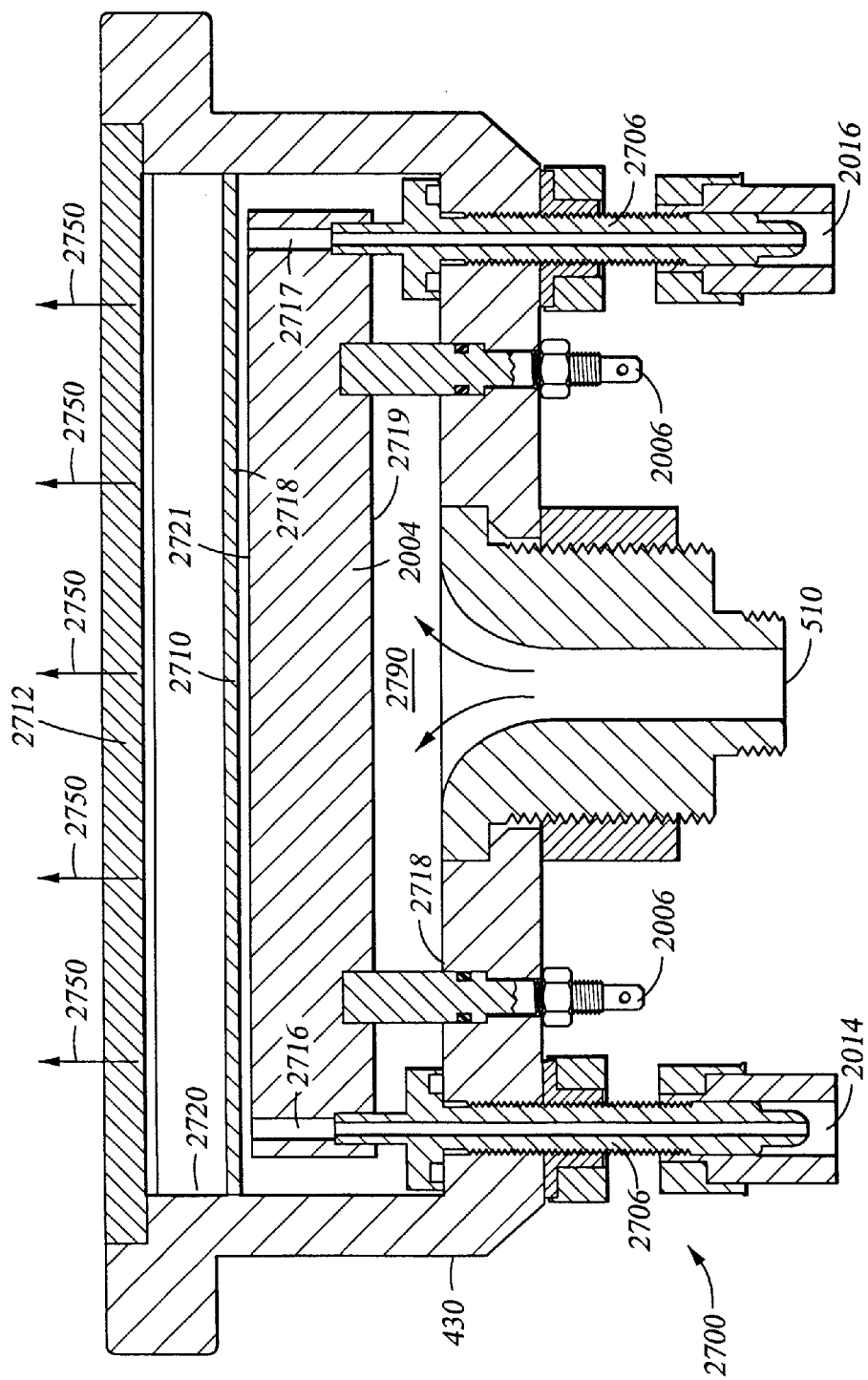
FIG. 27 is a cross sectional view of one embodiment of encapsulated anode included in an electroplating process cell.

This section of the disclosure describes a plurality of embodiments of flow diffuser 2712 as shown in FIG. 27. The flow diffuser 2712 is intended to provide a substantially uniform vertical velocity of electrolyte solution across the width of the electrolyte cell above the flow diffuser. The uniformity of the plating conditions across the substrate should therefore be enhanced due to the more uniform fluid flow conditions. The flow diffuser 2712 is constructed to be substantially rigid. In this disclosure, the term "rigid" indicates sufficient structural rigidity of the diffuser to limit sufficient deformation or bending of the diffuser, under the normal operating conditions in the process cell, that would alter the electric resistance between the anode and the seed layer. Such deformation would bend the diffuser so the center of the diffuser is nearer the nearest location on the substrate than the periphery of the diffuser is to its closest location on the substrate. The flow diffuser 2712 is preferably formed from microscopic, generally spherical, ceramic particles that are sintered to the adjacent spherical ceramic particles of the flow diffuser at the points of spherical contact. Ceramic is a naturally hydrophilic material. Other suitable, substantially rigid, materials may also be utilized. Voids or spaces are formed between the adjacent ceramic particles. The diffuser is designed with pores having dimensions from about 0.1 microns to about 500 microns. Since the fluid flow resistance through a flow diffuser is a function of the distance that the fluid travels through the flow diffuser, the vertical height of the diffuser can be altered to provide desired fluid flow characteristics. For example, a thicker flow diffuser with the same pore dimensions will provide an increased resistance to fluid flow through the flow diffuser to provide a more restricted fluid flow through the flow diffuser having similar pore dimensions. Electrolyte solution flowing through the diffuser from the anode to the seed layer on the substrate therefore flow through these voids. The minute dimensions, and curved paths, formed between adjacent spherical ceramic particles results in a slower, more diffused, electrolyte solution fluid flow through the diffuser. Depending on the dimensions of the voids, a slight pressure may be applied to the electrolyte solution below the flow diffuser to force the electrolyte solution through the voids upwardly through the flow diffuser. Though the flow diffuser 2712 is described as being formed from generally spherical, sintered ceramic particles, any shape particle that is configured with voids having small dimensions. The flow diffuser, that forms a substantially rigid structure, enhances the uniformity of the fluid flow of the electrolyte solution across the width of the process cell above the flow diffuser.

The encapsulated anode assembly 2700 comprises a bowl 430, an anode plate 2004, a bypass fluid inlet 2014, a bypass fluid outlet 2016, a hydrophilic membrane 2710, and the ceramic diffuser 2712. The ceramic diffuser 2712 interacts with the electrolyte solution flowing through the encapsulated anode assembly 2700 to enhance the uniformity of the fluid flow of electrolyte solution as the electrolyte solution contacts the substrate within the electrolyte solution contained in the electrolyte cell. The bowl 430 forms a recess 2715 in which the anode plate 2004 is supported. More particularly, the anode plate 2004 is horizontally positioned within the recess 2715. The encapsulated anode 2700 includes an electric feed through 2006 that is used to supply electric current/voltage to the anode and physically support the anode as described above relative to the embodiments shown in FIGS. 20–23.

Analyte posts 2706 support the anode plate 2004 within an anode chamber 2718 defined by the bowl 430 and the hydrophilic membrane 2710. The anode chamber 2718 extends to the anode plate 2004. The anode chamber 2718 is configured to allow the electrolyte solution within the bowl 430 to chemically react with the anode, thereby producing a supply of metal ions, e.g. copper ions, in the electrolyte solution.

In one embodiment, the cylindrical, ceramic, particles of the flow diffuser is configured occupy about 40% to about 80% of the volume of the flow diffuser. As such, the voids or pores between the spherical particles occupy about 20% to about 60% of the exterior volume of the flow diffuser. As such, as electrolyte solution flows through the flow diffuser, the maximum space that the electrolyte solution can occupy, per volume, within the space defined by the flow diffuser is from about 20% to about 60%.

The flow diffuser 2712 will not excessively bow or deform under the upward flow of the electrolyte solution within the electrolyte cell due to the rigidity of the construction of the anode. As such, the flow diffuser 2712 remains substantially flat (e.g. substantially in a single horizontal plane as shown in the embodiment in FIG. 27) as the electrolyte solution flows through the flow diffuser. The substantially non-bowed flow diffuser 2712 enhances the vertical flow of the electrolyte solution across the width of the electrolyte cell.

In a preferred embodiment, the encapsulated anode 2700 has a plastic or PVD housing that encloses the bottom and side of the anode plate. The membrane 2710 is attached to the plastic housing by, e.g., being supported by a support ring that extends around, and being attached to, the inner periphery of the bowl 430. The membrane is positioned above the top surface of the anode plate. The membrane and/or the encapsulated anode is removable from the bowl 430 to facilitate easy maintenance. Though the membrane 2710 and the flow diffuser 2712 are both shown as being positioned in the bowl 430 in FIG. 27, it is envisioned that the membrane 2710 and/or the flow diffuser 2710 may be located in the upper container body 472 as shown in FIG. 6. The membrane and the flow diffuser may also be located at any location in the process cell 420 between the anode and the substrate.

Electrolyte solution is supplied through two sources to the encapsulated anode assembly 2700 shown in the embodiment of FIG. 27. One electrolyte solution source into the encapsulated anode assembly 2700 is through the bypass fluid inlet 2014. The bypass fluid inlet 2014 is formed in an analyte post 2706. The bypass fluid inlet 2014 injects fluid to a channel 2716 formed within the anode. Fluid applied through the bypass fluid inlet 2014 flow through the channel 2716 to the anode chamber 2718 formed between the membrane 2710 and the anode plate 2004. Another electrolyte solution source is the electrolyte inlet 510 disposed through a bottom portion of the bowl 430. Electrolyte solution flowing through the electrolyte inlet 510 flows toward the bottom surface 2719 around the periphery of the anode plate 2004 to the anode chamber 2718, so the electrolyte solution is in fluid communication with the upper surface 2721 of the anode plate 2004.

There are two fluid outlets for electrolyte solution from the encapsulated anode assembly 2700 shown in FIG. 27. The first fluid outlet for the electrolyte solution is through the membrane 2710 and then the ceramic diffuser 2712 toward the substrate. This first fluid outlet allows electrolyte solution that is carrying metal ions to flow to the seed layer on the substrate to deposit the metal film on the seed layer. The second fluid outlet of the encapsulated anode assembly 2700 is through the channel 2717 that is in fluid communication with the bypass fluid outlet 2016 formed in an analyte post 2706. Channel 2717 extends from the upper surface 2721 of the anode plate 2004 through the anode plate. This connected configuration of the channel 2717 and the bypass fluid outlet 2016 forms a conduit that allows electrolyte solution containing anode sludge and other such particles to pass from the anode chamber 2718 to outside of the encapsulated anode. The electrolyte solution passing through the bypass fluid outlet 2716 is either discarded or filtered and then replenished as described relative to the electrolyte replenishing system 220 shown in FIG. 16. Replenished electrolyte solution is reintroduced into the electrolyte cell at electrolyte inlet 510.

The hydrophilic membrane 2710 is porous and comprises, for example, a polyvinyllidene fluoride membrane, having a porocity between about 60% and about 80%, more preferably about 70%, and ranging in pore width between about 0.025 µm and about 1 µm, more preferably between about 0.1 µm and about 0.2 µm. Hydrophilic membranes are produced by a variety of companies such as Millapore Corporation, located in Bedford, Mass. The hydrophilic membrane 2710 functions primarily to filter out anode sludge from the electrolyte solution that is flowing from the anode chamber 2718 to the diffuser 2712 (and the electroplating process cell 400). Metal ions that are contained within the electrolyte solution in the anode chamber 2718 will be allowed to pass through the membrane 2710 and through the diffuser 2712 to within the main body of the electroplating process cell 400.

The ceramic diffuser 2712 extends across an upper opening 2710 formed in the recess 2715 within the bowl 430. In this manner, the bowl 430 and the ceramic diffuser 2712 form an enclosed space 2790 in which the anode plate 2004 is contained. The feed-throughs 2706 and the electrolyte inlet 510 provide fluid communications through the bowl 430. One embodiment of the ceramic diffuser 2712 is hydrophilic and comprises an aluminum oxide or Alumina ($Al_2O_3$) of a high purity (e.g., the purity is higher than 99.9%). The ceramic diffuser 2712 provides a substantially uniform vertical fluid flow of electrolyte solution across the width of the electroplating process cell 400. The anode plate 2004 does not extend across the entire width of the electroplating process cell 400, so electrolyte solution may flow between the side of the anode and the inner surface of the bowl.

The electrolyte solution that flows through the electrolyte inlet 510 flows primarily around the anode plate 2004 through the anode chambers 2718 and up through the hydrophilic membrane 2710 and the ceramic diffuser 2712. The density of the flow diffuser pores (i.e. the void between the adjacent sintered spherical particles of the flow diffuser) is selected so that the electrolyte solution flows through the diffuser at a uniform rate across the width of the electroplating process cell 400. It is envisioned that the flow diffuser may be formed with a gradient of flow diffuser pores across the width of the flow diffuser to compensate for non-uniformities in electrolyte solution flow through the flow diffuser, if necessary. Fluid flow uniformity is enhanced by the use of the flow diffuser if the void size is selected to be such that a slight pressure (i.e. less than 20 psi difference across the flow diffuser) forces the electrolyte solution through the pores across the flow diffuser. This pressure difference from below the flow diffuser to above the flow diffuser enhances the uniformity of the velocity of the electrolyte solution flow across the flow of diffuser. In this manner, the fluid flow rate of the electrolyte solution above the diffuser is substantially uniform across the width of the interior of the electroplating process cell 400. Therefore, the electrolyte solution that contacts the seed layer on the substrate should be substantially uniform across the width of the electroplating process cell.

The ceramic material of the ceramic diffuser 2712 is configured to be rigid. This rigidity of the ceramic diffuser 2712 limits the amount of upward curvature or bowing of the ceramic diffuser 2712. The embodiment of flow diffuser shown in FIG. 27 shows a plurality of arrows 2750 to represent the direction of the bulk electrolyte flow through the ceramic diffuser 2712. The fluid flow of the electrolyte solution through the voids or pores generally follows the exterior outline of adjacent spherical ceramic particles forming the flow diffuser and flows as a function of the irregular angular orientations of the voids or pores on the plane defining generally the upper surface of the flow diffuser. However, those electrolyte solution flow components that are not directed perpendicularly from the surface of the flow diffuser tend to cancel. As such, the electrolyte solution flow through the flow diffuser becomes generally perpendicular to the upper (exit) surface of the flow diffuser. The arrows 2750 generally indicate the direction of flow of the electrolyte solution through the diffuser 2712.

In flow diffusers made from materials that exhibit a greater tendency to bow under the influence of the electrolyte solution fluid flow applied within the encapsulated anode assembly 2700, diffuser structural stiffeners 2751 may be affixed to the ceramic diffuser to support the ceramic diffuser and limit the bowing of the flow diffuser. The diffuser structural stiffeners 2751 may be positioned above and/or below the flow diffuser. The diffuser structural stiffeners may be configured as a ring that extends around the inner periphery of the bowl 430, a ring with a spoke configuration, a ring with a grid configuration, or any known arrangement that provides adequate support against bending to the flow diffuser. The flow diffuser may be attached to the diffuser structural stiffeners. A preferred embodiment of diffuser structural stiffener is formed from polyethelene, or other plastic or elastomeric material. The diffuser structural stiffeners 2751 are attached at either end to the inner recess 2720 and may be removed from the bowl 430 to be repaired or replaced. The horizontal cross sectional area of the diffuser structural stiffeners is minimized to enhance the uniformity of the fluid flow through the ceramic diffuser by limiting the structural stiffeners blocking the fluid flow. In one embodiment, the diffuser structural stiffeners 2751 are disposed on the higher pressure (lower) side of the diffuser to enhance uniform flow through the diffuser.

Figure 28:
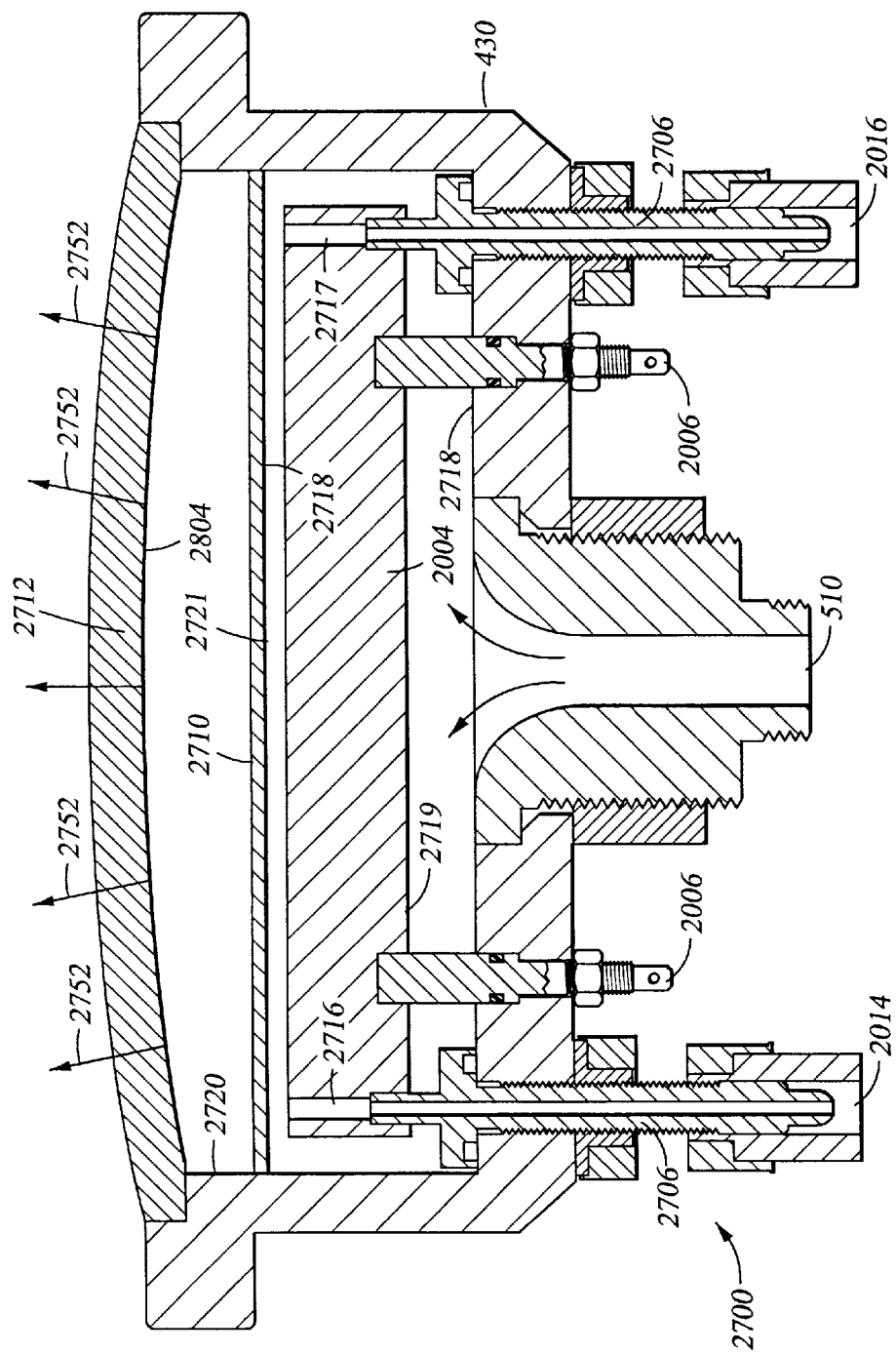
FIG. 28 is the electroplating process cell shown in FIG. 27 including a more flexible diffuser than the ceramic diffuser shown in FIG. 27.

FIG. 28 shows the electroplating process cell 400 shown in FIG. 27 having a diffuser 2802 made from an exemplary, more flexible, material located in the same position as the ceramic flow diffuser used in the embodiment shown in FIG. 27. The bottom surface 2804 of the diffuser 2802 follows a bottom diffuser outline curve 2804. The deflection of the bottom diffuser outline curve 2804 of the ceramic diffuser is exaggerated in FIG. 28 to indicate the effects on the fluid flow of the electrolyte solution through the flow diffuser. The direction of the bulk electrolyte fluid flow through the bowed diffuser 2802, with a bottom surface contoured as shown by the bottom diffuser outline curve 2804, is indicated by arrows 2806. One embodiment of diffuser is secured to, and strengthened by, a diffuser structural stiffener as described in the embodiment in FIG. 27.

The bulk electrolyte flow of the bowed flexible diffuser 2802 directs electrolyte solution at a higher rate to the vertical periphery of the electroplating process cell 400 than the vertical center of the electroplating process cell. A greater percentage of metal ions contained in the electrolyte solution are directed toward the vertical periphery of the electroplating process cell than toward the vertical center of the electroplating process cell 400 in the embodiment of FIG. 28 than FIG. 27. As such, substrate being plated within the electroplating process cell 400 using the flexible diffuser 2802 that exhibits a greater deposition rate near the center of the seed layer on the substrate than with the ceramic diffuser 2712. The stiff ceramic diffuser 2712 that retains its flat configuration directs electrolyte solution (and metal ions contained therein) uniformly in a vertical direction. This vertical directing of the electrolyte solution limits the production of gradient of metal ions in the electrolyte solution across the width of the electroplating process cell.

In considering the path of the electric flux within the electrolyte cell from the anode to the seed layer, the flow diffuser can be considered as acting as a "virtual anode" in which the diffuser appears, to the substrate, to be generating the electric flux as such, the substrate "comsiders" the flow diffuser to act as the anode. Since a flow diffuser is physically positioned between the actual anode and a substrate in the seed layer on the substrate, electric flux flowing from the anode to the seed layer has to flow through the flow diffuser. Due to this positioning of the flow diffuser, the flow diffuser may "appear" to the seed layer as the anode generating the electromagnetic fields instead of the actual anode. The flow diffuser (i.e. the virtual anode) shares some basic electromagnetic properties with the actual anode. For example, the electrical resistance between a particular location on the flow diffuser and the substrate seed layer, is a function of the distance between the flow diffuser to the seed layer. If the flow diffuser is bowed to form an upward-directed convex surface, center portions of the flow diffuser are displaced closer than the peripheral portions of the flow diffuser to the respective nearest location on the seed layer. Since electrical resistance is a function of distance, for a bowed flow diffuser, the electrical resistance for electrical current flowing from the center of the flow diffuser through the electrolyte solution to the nearest point on the substrate seed layer is less than the electric resistance through the electrolyte solution from the peripheral portions of the flow diffuser to the nearest point on the substrate seed layer. Since the electric resistance will be less near the center of the flow diffuser, a higher electrical current will be established from the center of the flow diffuser to the center of the seed layer as compared to the electric current to from the periphery of the diffuser to the seed layer. As such, the electric current density at the center of the seed layer will be greater relative to the electric current density at the periphery of the seed layer. An enhanced electric current density at the center compared with the periphery of the seed layer results in an increased deposition rate of metal film on the center compared with the periphery of the seed layer since metal film deposition rate is a function of electric current density at each particular location on the seed layer. As such, a rigid flow diffuser that does not bend excessively, as shown in the embodiment in FIG. 27, will provide enhanced uniformity of electric current density across the seed layer, this enhanced uniformity of electric current density also results in an enhanced uniformity of metal film deposition rate across the seed layer.

Another benefit of the rigid diffuser shown in the embodiment in FIG. 27 relates to stabilization time. The fluid flow of the electrolyte solution across the flow diffuser, indicated by arrows 2750, is substantially uniform in a vertical direction. The fluid flow of the electrolyte solution exiting above the flow diffuser in the embodiment shown in FIG. 28, as indicated by arrows 2752, is not generally parallel and increases turbulent flow across the width of the electrolyte cell above the flow diffuser. The parallel flow in the embodiment of FIG. 27 results in a limitation of the generation of eddy currents that may lead to the generation of turbulent flow. The enhanced parallel flow and flow uniformity above the flow diffuser results in a shorter distance necessary for the fluid flow above the flow diffuser to revert to a substantially laminar fluid flow in the upwardly vertical direction in the embodiment shown in FIG. 27. Furthermore, since the ceramic diffuser 2712 remains flat and does not bow excessively upwardly, the distance between all upper surface locations on the flow diffuser and the respective nearest seed layer locations are not reduced. Therefore, not only does the electrolyte fluid that is exiting the flow diffuser flow require less distance to return to a laminar flow, but also the electrolyte solution does not encounter a reduced distance to flow to allow the electrolyte solution to return to its normal laminar flow after it exits above the flow diffuser before it comes in contact with the seed layer.

Another characteristic of the ceramic diffuser 2712 is an enhanced pressure production applied to the electrolyte solution below the diffuser. The bowing of the flow diffuser may act to reduce pressure under the flow diffuser by allowing the volume between the flow diffuser and the bowl to increase. The flow diffuser 2712 is configured with relatively small dimensional voids that are sized to provide an increased pressure build-up within the bowl 430. The membrane 2710 in the electrolyte container above the anode is positioned to provides a high impedance to electrolyte solution fluid flow that produces back pressure in the electrolyte solution below the flow diffuser. The back pressure enhances the electrolyte solution fluid flow down through the membrane 2710 covering the anode. A fluid impedance created by the flow diffuser 2712 and the membrane 2710 can be viewed as decreasing the upward electrolyte solution flow, or increasing the downward electrolyte solution flow directed at the upper surface of the anode. Such an enhanced downward motion of electrolyte solution at the upper surface of the anode plate 2004 enhances the laminar flow of electrolyte solution, and limits the turbulent flow of the electrolyte solution past the anode. The enhanced laminar electrolyte solution flow past the surface of the anode limits the air bubbles in the electrolyte solution at the anode surfaces. For example, for a 200 nm substrate is being located in the encapsulated anode assembly 2700, a flow rate of about a 4.5 gallon/minute through the electrolyte inlet 510 provides a pressure of about 1.5 psig within the encapsulated anode assembly 2700. The flow rate of electrolyte solution through the electrolyte inlet 510 or the porosity of the ceramic diffuser can be modified to effect the resultant flow rate and pressure of the electrolyte solution within the electroplating process cell 400.

The pressure applied to the electrolyte solution within the electroplating process cell 400 is applied to within the anode chamber 2718 between the upper surface 2721 of the anode plate 2004 and the ceramic diffuser 2712. It is envisioned that a pressure drop from a fraction of one to about 6 psig may be applied across the flow diffuser during the plating operation of the electroplating process cell 400. This pressure is substantial enough to remove gas bubbles, particularly air, remaining on the upper or other portions of the anode plate 2004 around the hydrophilic membrane 2710, and in the ceramic diffuser 2712 following start-up.

Start-up is a procedure that the process cells of the ECP system undergo when the fluid flow of electrolyte solution into the inlet 510 is started. An electric bias voltage is established between the anode and the seed layer on the substrate during start-up. Start-up is performed before a substrate is immersed in the electrolyte solution. It is desired to remove gas bubbles from within the electrolyte solution in the process cell before the substrate is immersed in the electrolyte solution. If gas bubbles remain within the electrolyte solution during or following start-up, the escaping gas bubbles can be forced against the substrate to cause pitting of the substrate surface. Additionally, the escaping gas bubbles can be trapped under the substrate and/or substrate holder and interfere with the electrolyte solution contacting the seed layer and therefore also interfere with the plating process that requires contact between the electrolyte solution and the seed layer.

The pressure applied to the electrolyte solution within the electroplating process cell 400 during start-up decreases the physical dimensions of the individual gas bubbles. The smaller gas bubbles being forced through the diffuser by greater fluid pressure will allows bubbles having a sufficiently decreased volume as a result of the increased pressure to flow through the diffuser, that contains pores having a fixed size. The general upward flow of the gas bubbles through the hydrophilic membrane 2710 and the ceramic diffuser 2712 to exit through an opening in the electroplating process cell during start-up result since smaller sized bubbles are less likely to be physically trapped in pores of the same size, and as such the gas bubbles flow more easily through the diffuser and membrane as a result of the dimensions and configurations of the pores. The increased pressure that is established in the electrolyte solution below the diffuser limits the turbulence and eddies of the flow of electrolyte solution applied to the upper surface 2721 of the anode plate 2004. The improvement of the fluid flow of electrolyte solution to the upper surface improves the uniformity of the chemical reaction between the electrolyte solution and the anode across the width of the anode plate since the electrolyte solution is forced into closer contact with the anode, and a lesser volume of air bubbles are trapped about the anode. In addition, the pressure acts to force these gasses through the hydrophilic membrane 2710 as well as the ceramic diffuser 2712. The application of the increased pressure within the encapsulated anode assembly 2700 therefore acts to remove the gasses that form into bubbles within the encapsulated anode assembly 2700 during the initial startup phase of the electroplating process cell 400.

The initial startup of the electroplating process cell 400 is performed when the substrate holding assembly 450 is removed from the electroplating process cell 400. During the initial startup, as electrolyte solution is pumped into the cell 400, pressure is established within the electrolyte cell below the diffuser. The pressure applied within the electrolyte solution acts to diminish the dimension of the bubbles, apply a more laminar flow to the anode, and force contained bubbles in the electrolyte solution (the bubbles have decreased dimensions) through the diffuser; all of which act to remove bubbles from the electrolyte solution contained within the electrolyte cell. Since the ceramic diffuser is hydrophilic, the bubbles are attracted to the diffuser as a result of the material properties of the diffuser, and forced through the diffuser as a result of the fluid pressure applied across the diffuser. In this manner, as many of the bubbles as possible will be removed from the encapsulated anode assembly 2700 from within the electroplating process cell 400 prior to the insertion of the substrate, being held by the substrate holder assembly 450, into the electrolyte solution. Limiting the application of gas bubbles contained in the electrolyte solution against the substrate also limits potential pitting or damage the seed layer on a substrate immersed in the electroplating cell.

The ceramic diffuser 2712 is shown in the embodiments of FIGS. 27 and 28 as being integrated within an encapsulated anode. The ceramic diffuser can be applied to any process cell, having any anode configuration, in any metal film deposition system that contains an anode. Though Alumina is described as the material that the diffuser is formed from, any suitable ceramic that can withstand the chemicals and pressures of the electrolyte solution may be provided.

Figure 29:
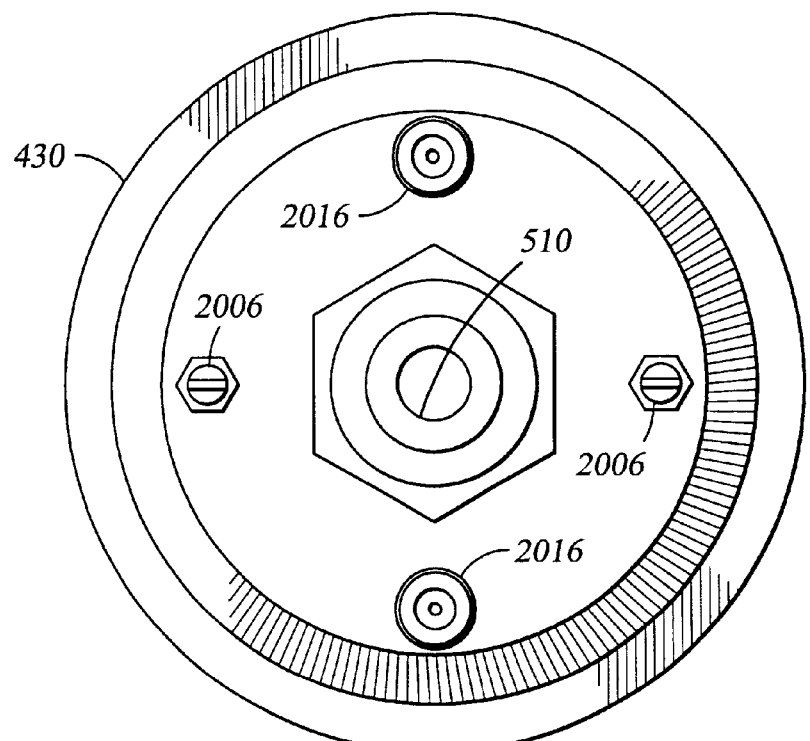
FIG. 29 shows a bottom perspective view of one embodiment of bowl of FIG. 27.
Figure 30:
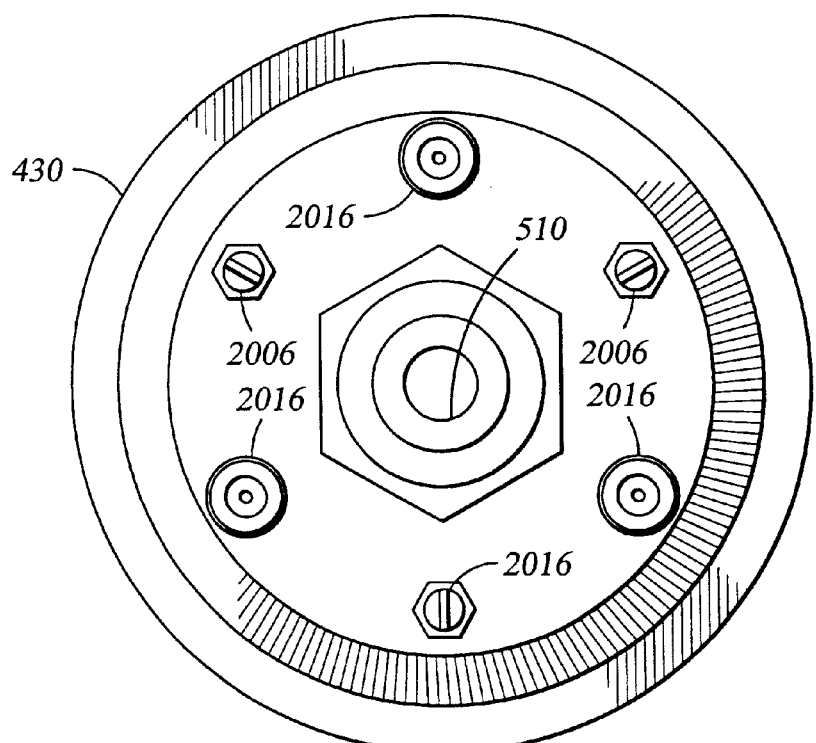
FIG. 30 shows a bottom perspective view of another embodiment of bowl of FIG. 27.

FIG. 27 shows a bowl 430 including an encapsulated anode assembly 2700 having a bypass fluid inlet 2014, a bypass outlet 2016, and a plurality of electric feed-throughs 2006. FIGS. 29 and 30 show a bottom view of two alternate embodiments of bowls 430 that display the positioning of a plurality of bypass outlets 2016 and a plurality of electric feed-throughs 2006.

In the embodiment of bowl 430 shown in FIG. 29, the electric feed-throughs 2006 are spaced about the electrolyte solution inlet 510 in the bowl 430 by 180 degrees. Additionally, a plurality of bypass outlets 2016 are spaced around electrolyte solution inlet 510 in the bowl 430 by 180 degrees. Each electric feed-through 2006 is spaced from each one of the adjacent pair of bypass outlets 2016 by 90 degrees. In the embodiment of bowl 430 shown in FIG. 30, the electric feed-throughs 2006 are evenly spaced about the electrolyte solution inlet 510 in the bowl 430 by 120 degrees. Additionally, a plurality of bypass outlets 2016 are evenly spaced around electrolyte solution inlet 510 in the bowl 430 by 120 degrees. Each electric feed through 2006 is spaced from each one of the adjacent pair of bypass outlets 2016 by 60 degrees. The structure and operation of each electric feed through 2016, bypass fluid outlet 2016, and bypass fluid inlet 2014 in the embodiments shown in FIGS. 29 and 30, is similar to the structure and operation of the respective elements shown in, and described relative to, the embodiment in FIG. 27.

In a preferred embodiment of bowl 430, any other equal radial spacing of electric feed-throughs 2006 may be provided radially about the electrolyte solution inlet 510. Additionally, any other equal radial spacing of bypass outlets 2016 may be provided radially about the electrolyte solution inlet 510. It is important to provide such even spacing of the electric feed-throughs 2006 since the positioning of the electric feed throughs may effect the electric current density in any location in the anode. The locations in the anode that are closer to the electric feed-throughs have a higher current density compared to the locations in the anode that are further from the electric feed throughs. Those locations on the surface of the anode with a higher current density that contacts the electrolyte solution has a greater chemical reaction with the electrolyte solution than those locations having a lower current density on the surface of the anode that contacts the electrolyte solution. Distributing the electric feed throughs substantially evenly about the bowl 430 enhances the uniformity of the electric current density around the upper surface of the anode. The enhancement of the electric current deposition around the upper surface of the anode results in enhancing the uniformity of the chemical reaction of the upper surface of the anode with the electrolyte solution. Such enhancement of the uniformity of the chemical reaction of the upper surface the anode prolongs the useful lifetime of the anode since anodes become unsuitable for ECP if the upper surface of the anode is too uneven. Providing an anode with a level surface enhances the distance between the surface of the anode and the seed layer on the substrate. A more uniform distance between the anode and the seed layer results in more uniform electric current density applied across the seed layer, and a more uniform deposition rate across the seed layer. As such, providing a substantially equal radial spacing of electric feed-throughs 2006 about the electrolyte solution inlet 510 results in more uniform metal film deposition on the seed layer, a more uniform upper surface to the anode after considerable use, and a longer lifetime to the anode.

In a preferred embodiment of bowl 430, any other equal radial spacing of bypass outlets 2016 may be provided radially about the electrolyte solution inlet 510. The fluid flow rate of the electrolyte solution is increased proximate the bypass outlet 2016. As such, the etching rate of the anode may be increased adjacent the bypass outlets. Additionally, the lack of any surface area of the anodes at the bypass outlet reduces the electric current density adjacent the bypass outlets since an anode surface generates a higher electric current density than a void. For the same reasons described above describing why providing a substantially equal radial spacing of electric feed-throughs 2006 about the electrolyte solution inlet 510 results in more uniform metal film deposition on the seed layer, a more uniform upper surface to the anode after considerable use, and a longer lifetime to the anode; providing a substantially equal radial spacing of bypass outlets about the electrolyte solution inlet 510 can have the same effect.

In the embodiment of bowl 430 in FIGS. 29 and 30, there is no bypass fluid inlet 2014 as shown in FIG. 27. As such, all of the electrolyte solution entering the bowl flows through the electrolyte solution inlet 510. In alternate embodiments, a plurality of bypass fluid inlets 2014 may be provided with a substantially equal radial spacing about the electrolyte solution inlet 510. Providing a substantially equal radial spacing of bypass fluid inlets 2014 about the electrolyte solution inlet 510 may result in a more uniform metal film deposition on the seed layer, a more uniform upper surface to the anode after considerable use, and a longer lifetime of the anode.

While the foregoing is directed to the preferred embodiment of the present invention, other and further embodiments of the invention may be devised without departing from the basic scope thereof.

What is claimed is:

1. An apparatus comprising:
  an electrolyte cell having an opening configured to receive a substrate to have a metal film deposited thereon;
  an anode contained within the electrolyte cell; and
  a porous, rigid diffuser extending across the electrolyte cell and positioned between the opening and the anode, wherein the diffuser is made from a ceramic and has a generally uniform thickness.

2. The apparatus of claim 1, further comprising a fluid supply that is fluidly connected to the electrolyte cell that is configured to supply fluid under pressure to the electrolyte cell at a location proximate the anode.

3. The apparatus of claim 2 wherein the porous rigid diffuser is positioned to maintain said pressure in a portion of the electrolyte cell below the porous rigid diffuser.

4. The apparatus of claim 3, wherein the rigidity of the porous rigid diffuser is sufficient to limit substantial deformation of the porous rigid diffuser under said pressure.

5. The apparatus of claim 2, wherein the pressure is sufficient to remove gas bubbles that are contained in the porous rigid diffuser.

6. The apparatus of claim 1, wherein the porous, rigid diffuser is made from a plurality of substantially rigid ceramic particles coupled together to form spaces between the particles.

7. The apparatus of claim 6, wherein the spaces between the particles are from about 0.1 $\mu$m to about 500 $\mu$m.

8. The apparatus of claim 6, wherein the particles occupy about 40% to about 80% of the volume of the diffuser.

9. The apparatus of claim 6, wherein the spaces between the particles occupy about 20% to about 60% of the volume of the diffuser.

10. The apparatus of claim 1, wherein the diffuser is supported by a structural stiffener connected to the electrolyte cell.

11. The apparatus of claim 10, wherein the structural stiffener comprises a ring with one of a spoke configuration and a grid configuration.

12. The apparatus of claim 1, further comprising a porous membrane disposed between the anode and the diffuser.

13. The apparatus of claim 12, wherein the porous membrane is configured to filter out anode sludge flowing from the anode to the diffuser.

14. The apparatus of claim 1, wherein the diffuser is configured to remain substantially flat as an electrolyte solution flows through the diffuser.

15. The apparatus of claim 1, wherein the diffuser is configured to generate an electric flux between the diffuser and the substrate.

16. The apparatus of claim 1, wherein the diffuser is configured to provide uniform electric current density across the substrate as an electrolyte solution flows through the diffuser.

17. An apparatus comprising:
  an electrolyte cell configured to receive a substrate to have a metal film deposited thereon;
  an anode contained within the electrolyte cell; and
  a porous, rigid diffuser that is connected to the electrolyte cell and extends across the electrolyte cell, wherein the diffuser is positioned between a location that the substrate is to be positioned when the metal film is deposited thereon and the anode, wherein the porous rigid diffuser is made from a ceramic.

18. The apparatus of claim 17, wherein the porous, rigid diffuser includes a high purity alumina.

19. An apparatus comprising:
  an electrolyte cell configured to receive a substrate to have a metal film deposited thereon;
  an anode contained within the electrolyte cell; and
  a porous, rigid diffuser that is connected to the electrolyte cell and extends across the electrolyte cell, wherein the diffuser is positioned between a location that the substrate is to be positioned when the metal film is deposited thereon and the anode, wherein the porous, rigid diffuser is hydrophilic.

20. An apparatus comprising:
  an electrolyte cell configured to receive a substrate to have a metal film deposited thereon;
  an anode contained within the electrolyte cell; and
  a porous, rigid diffuser that is connected to the electrolyte cell and extends across the electrolyte cell, wherein the diffuser is positioned between a location that the substrate is to be positioned when the metal film is deposited thereon, and the anode, wherein the porous, rigid diffuser has pore sizes from about 45 $\mu$m to about 90 $\mu$m.

21. An apparatus comprising:
  an electrolyte cell configured to receive a substrate to have a metal film deposited thereon;
  an anode contained within the electrolyte cell;
  a porous rigid diffuser that is connected to the electrolyte cell and extends across the electrolyte cell, wherein the diffuser is positioned between a location that the substrate is to be positioned when the metal film is deposited thereon and the anode; and
  a membrane extending across the electrolyte cell between the anode and the porous rigid diffuser.

22. The apparatus of claim 21, further comprising a fluid pressure source that fluidly supplies electrolyte solution to the electrolyte cell that is configured to apply electrolyte solution under pressure to the anode.

23. The apparatus of claim 22, wherein the pressure is applied between the diffuser and the anode.

24. The apparatus of claim 21, wherein the membrane is a hydrophilic membrane.

25. An apparatus comprising:
   an electrolyte cell configured to receive a substrate to have a metal film deposited thereon;
   an anode contained within the electrolyte cell;
   a porous rigid diffuser that is connected to the electrolyte cell and extends across the electrolyte cell, wherein the diffuser is positioned between a location that the substrate is to be positioned when the metal film is deposited thereon and the anode; and
   a bowl to encase the anode, wherein a plurality of electric feed throughs are substantially equally spaced radially about the bowl.

26. An apparatus comprising:
   an electrolyte cell configured to receive a substrate to have a metal film deposited thereon;
   an anode contained within the electrolyte cell;
   a porous rigid diffuser that is connected to the electrolyte cell and extends across the electrolyte cell, wherein the diffuser is positioned between a location that the substrate is to be positioned when the metal film is deposited thereon and the anode; and
   a bowl to encase the anode, wherein a plurality of bypass outlets are substantially equally spaced radially about the bowl.

27. A method of electrochemical plating on a seed layer of a substrate located in an electrolyte cell containing electrolyte solution, comprising:
   extending a porous ceramic diffuser across the electrolyte cell;
   applying fluid pressure to the electrolyte solution contained in the electrolyte cell below the ceramic diffuser; and
   inserting a substrate to undergo electro-chemical plating in the electrolyte cell above the ceramic diffuser.

28. The method claim 27, wherein the applying pressure enhances removal of gas bubbles from the porous ceramic diffuser.

29. The method of claim 27, further comprising positioning an anode in the electrolyte solution below the ceramic diffuser.

30. The method of claim 27, wherein the pressure enhances the uniformity of generation of metal ions generated by the chemical reaction between the electrolyte solution and the anode.

31. The method of claim 27, wherein the pressure in the electrolyte solution enhances the fluid contact between the electrolyte solution and the anode.

32. The method of claim 27, wherein the porous ceramic diffuser is sufficiently rigid to resist its bowing under said pressure.

33. The method of claim 32, wherein the rigidity of the ceramic diffuser enhances the substantially uniform fluid flow across the width of the electrolyte cell.

34. An apparatus for use in an electrolyte cell, the apparatus comprising:
   a porous ceramic diffuser that is connected to and extends across the electrolyte cell, the porous ceramic diffuser is positioned between the top opening and an anode positioned in the electrolyte cell, wherein the ceramic diffuser is formed from sintered particles of ceramic having pores extending between the sintered particles.

35. The apparatus of claim 34, further comprising a diffuser structural stiffener mounted to the electrolyte cell and attached to and supporting the porous ceramic diffuser.

36. An apparatus comprising:
   an electrolyte cell including a bowl;
   an anode mounted within the bowl, wherein a plurality of electric feed throughs are substantially equally spaced radially about the bowl;
   a porous ceramic diffuser that is connected to and extends across the electrolyte cell, the porous ceramic diffuser is positioned between the top opening and an anode positioned in the electrolyte cell, wherein the ceramic diffuser is formed from sintered particles of ceramic having pores extending between the sintered particles; and
   a diffuser structural stiffener mounted to the electrolyte cell and attached to and supporting the porous ceramic diffuser.

37. The apparatus of claim 36, further comprising a plurality of bypass outlets that are substantially equally spaced radially about the bowl.

38. The apparatus of claim 36, further comprising a plurality of bypass inlets that are substantially equally spaced radially about the bowl.

* * * * *

UNITED STATES PATENT AND TRADEMARK OFFICE
CERTIFICATE OF CORRECTION

PATENT NO. : 6,585,876 B2
DATED : July 1, 2003
INVENTOR(S) : Dordi et al.

It is certified that error appears in the above-identified patent and that said Letters Patent is hereby corrected as shown below:

Title page,
Item [75], please change "Palo Alt" to -- Palo Alto --.

Column 8,
Line 59, please change "180" to -- 780 --.

Column 9,
Line 6, please change "SO" to -- so --.

Column 10,
Line 44, please change "$\sigma R$" to -- $\Sigma R$ --.

Column 15,
Line 51, please change "214, S and" to -- 214, and --.

Column 17,
Line 3, please change "TEFLONE" to -- TEFLON® --.

Signed and Sealed this

Thirtieth Day of December, 2003

JAMES E. ROGAN
*Director of the United States Patent and Trademark Office*